(12) United States Patent
Flemming et al.

(10) Patent No.: US 8,709,702 B2
(45) Date of Patent: Apr. 29, 2014

(54) METHODS TO FABRICATE A PHOTOACTIVE SUBSTRATE SUITABLE FOR MICROFABRICATION

(75) Inventors: Jeb H. Flemming, Albuquerque, NM (US); Colin T. Buckley, Albuquerque, NM (US); R. Blake Ridgeway, Albuquerque, NM (US)

(73) Assignee: 3D Glass Solutions, Albuquerque, NM (US)

( * ) Notice: Subject to any disclaimer, the term of this patent is extended or adjusted under 35 U.S.C. 154(b) by 0 days.

(21) Appl. No.: 13/024,952

(22) Filed: Feb. 10, 2011

(65) Prior Publication Data

US 2011/0195360 A1    Aug. 11, 2011

Related U.S. Application Data

(60) Provisional application No. 61/303,091, filed on Feb. 10, 2010.

(51) Int. Cl.
*G03F 7/20*    (2006.01)

(52) U.S. Cl.
USPC .......................................... 430/314; 430/311

(58) Field of Classification Search
USPC .................................. 430/313, 323, 314, 330
See application file for complete search history.

(56) References Cited

U.S. PATENT DOCUMENTS

| | | |
|---|---|---|
| 2,628,160 A | 2/1953 | Stookey |
| 2,684,911 A | 7/1954 | Stookey |
| 2,971,853 A | 2/1961 | Stookey |
| 5,078,771 A | 1/1992 | Wu |
| 5,212,120 A | 5/1993 | Araujo et al. |
| 6,678,453 B2 | 1/2004 | Bellman et al. |
| 6,932,933 B2 | 8/2005 | Helvajian et al. |
| 7,132,054 B1 | 11/2006 | Kravitz et al. |
| 7,306,689 B2 | 12/2007 | Okubora et al. |
| 7,603,772 B2 | 10/2009 | Farnworth et al. |
| 8,062,753 B2 | 11/2011 | Shcreder et al. |

(Continued)

FOREIGN PATENT DOCUMENTS

| | | |
|---|---|---|
| WO | 2008119080 A1 | 10/2008 |
| WO | 2011100445 A1 | 8/2011 |

OTHER PUBLICATIONS

International Technology Roadmap for Semiconductors, 2007 Edition, "Assembly and Packaging,"9 pages.

(Continued)

*Primary Examiner* — Cynthia Kelly
*Assistant Examiner* — Caleen Sullivan
(74) *Attorney, Agent, or Firm* — Chalker Flores, LLP; Chainey P. Singleton

(57) ABSTRACT

A method of fabrication and device with holes for electrical conduction made by preparing a photosensitive glass substrate comprising at least silica, lithium oxide, aluminum oxide, and cerium oxide, masking a design layout comprising one or more holes to form one or more electrical conduction paths on the photosensitive glass substrate, exposing at least one portion of the photosensitive glass substrate to an activating energy source, exposing the photosensitive glass substrate to a heating phase of at least ten minutes above its glass transition temperature, cooling the photosensitive glass substrate to transform at least part of the exposed glass to a crystalline material to form a glass-crystalline substrate and etching the glass-crystalline substrate with an etchant solution to form the one or more depressions or through holes for electrical conduction in the device.

28 Claims, 11 Drawing Sheets

A

B

(56) References Cited

U.S. PATENT DOCUMENTS

| | | | |
|---|---|---|---|
| 8,096,147 B2 | 1/2012 | Flemming et al. | |
| 2003/0025227 A1 | 2/2003 | Daniell | |
| 2004/0137372 A1* | 7/2004 | Livingston et al. | 430/311 |
| 2004/0198582 A1 | 10/2004 | Borrelli et al. | |
| 2006/0017778 A1* | 1/2006 | Okuno | 347/50 |
| 2008/0245109 A1* | 10/2008 | Flemming et al. | 65/387 |
| 2011/0170273 A1* | 7/2011 | Helvajian | 361/761 |
| 2011/0217657 A1 | 9/2011 | Flemming et al. | |

OTHER PUBLICATIONS

Bakir, Muhannad S., et al., "Revolutionary Nanosilicon Ancillary Technologies for Ultimate-Performance Gigascale Systems," IEEE 2007 Custom Integrated Circuits Conference (CICC), 2007, pp. 421-428.

Crawford, Gregory P., "Flexible Flat Panel Display Technology," John Wiley and Sons, NY, (2005), 9 pages.

Dietrich, T.R., et al., "Fabrication Technologies for Microsystems Utilizing Photoetchable Glass," Microelectronic Engineering 30, (1996), pp. 407-504.

Quantum Leap, "Liquid Crystal Polymer (LCP) LDMOS Packages," Quantum Leap Datasheet, (2004), miconnelly.com/QLPKG.Final_LDMOS_DataSheet.pdf, 2 pages.

Scrantom, Charles Q., "LTCC Technology—Where We Are and Where We're Going—IV," Jun. 2000, 12 pages.

Intel Corporation, "Intel® 82566 Layout Checklist (version 1.0)", 2006.

Brusberg, et al. "Thin Glass Based Packaging Technologies for Optoelectronic Modules" Electronic Components and Technology Conference, May 26-29, 2009, pp. 207-212, DOI: 10.1109/ECTC.2009.5074018, pp. 208-211; Figures 3, 8.

Cheng, et al. "Three-dimensional Femtosecond Laser Integration in Glasses" The Review of Laser Engineering, vol. 36, 2008, pp. 1206-1209, Section 2, Subsection 3.1.

Dang, et al. "Integrated thermal-fluidic I/O interconnects for an on-chip microchannel heat sink," IEEE Electron Device Letters, vol. 27, No. 2, pp. 117-119, 2006.

Gomez-Morilla, et al. "Micropatterning of Foturan photosensitive glass following exposure to MeV proton beams" Journal of Micromechanics and Microengineering, vol. 15, 2005, pp. 706-709, DOI:10.1088/0960-1317/15/4/006.

International Search Report and Written Opinion for PCT/US2011/024369 dated Mar. 25, 2011, 13 pp.

International Search Report and Written Opinion for PCT/US2008/058783 dated Jul. 1, 2008, 15 pp.

Wang, et al. "Optical waveguide fabrication and integration with a micro-mirror inside photosensitive glass by femtosecond laser direct writing" Applied Physics A, vol. 88, 2007, pp. 699-704, DOI:10.1007/S00339-007-4030-9.

* cited by examiner

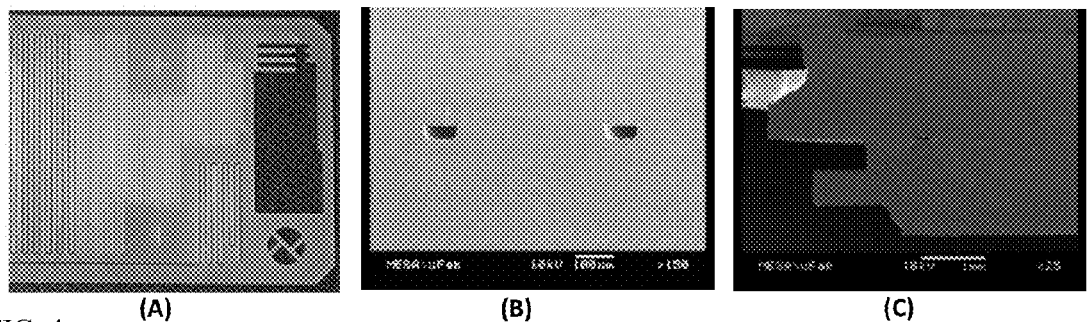
FIG. 4
FIG. 5    5A    5B
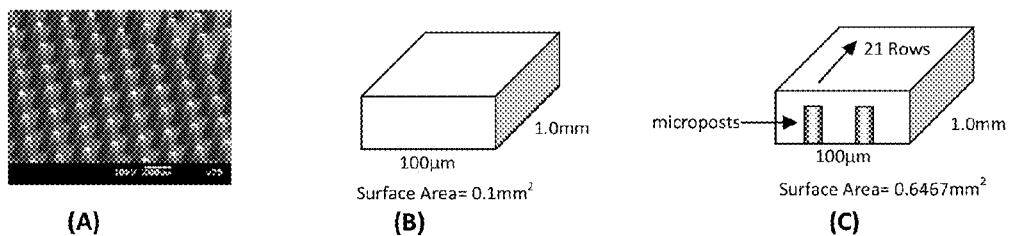
FIG. 6
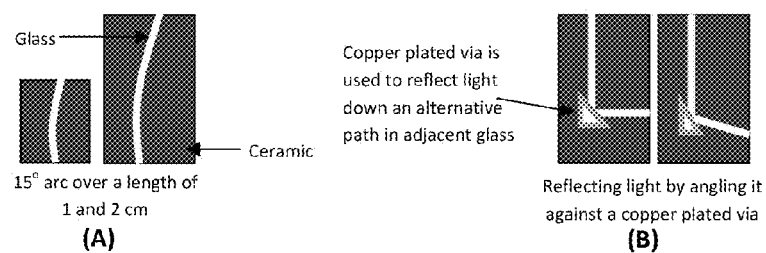
FIG. 7

METHODS TO FABRICATE A PHOTOACTIVE SUBSTRATE SUITABLE FOR MICROFABRICATION

CROSS-REFERENCE TO RELATED APPLICATIONS

This application claims priority to U.S. Provisional Application Ser. No. 61/303,091, filed Feb. 10, 2010, the contents of which are incorporated by reference herein in its entirety.

FIELD OF THE INVENTION

The present invention relates to a method to fabricate a shaped glass structure with a high-anisotropic-etch ratio and, in particular, a method to fabricate a shaped glass structure with a high-anisotropic-etch ratio using a novel photosensitive glass composition.

STATEMENT OF FEDERALLY FUNDED RESEARCH

None.

INCORPORATION-BY-REFERENCE OF MATERIALS FILED ON COMPACT DISC

None.

BACKGROUND OF THE INVENTION

Photosensitive glass structures have been suggested for a number of micromachining and microfabrication processes such as inkjet printer heads, electrodes for high quality head phones, micro-lens arrays, positioning devices, and hollow microneedle arrays being developed for transdermal drug delivery and the withdrawal of body fluids for biomedical and other applications. Unfortunately, silicon microfabrication processes are long, difficult, and expensive. These microfabrication processes rely on expensive capital equipment; X-ray lithography and deep reactive ion etching machines which generally cost in excess of one million dollars each and require an ultra-clean, high-production silicon fabrication facility costing millions more.

Today's packaging has become the limiting element in system cost and performance for integrated circuit (IC) development. Assembly and packaging technologies have become primary differentiators for manufactures and the trend towards smaller form factor electronics in consumer markets are increasing performance demands. Traditional packaging approaches to address the needs in these "High Density Portable" markets, including FR4, liquid crystal polymers, and Low Temperature Co-Fired Ceramics (LTCC), are running into fundamental material limits. Customer requirements include smaller packaging layer thicknesses, even higher density interconnects, in-package thermal management and future optical waveguide capability.

SUMMARY OF THE INVENTION

The present invention provides a method to fabricate a device with holes for electrical conduction by preparing a photosensitive glass substrate comprising at least silica, lithium oxide, aluminum oxide, and cerium oxide; masking a design layout comprising one or more holes to form one or more electrical conduction paths on the photosensitive glass substrate; exposing at least one portion of the photosensitive glass substrate to an activating energy source; exposing the photosensitive glass substrate to a heating phase of at least ten minutes above its glass transition temperature; cooling the photosensitive glass substrate to transform at least part of the exposed glass to a crystalline material to form a glass-crystalline substrate; and etching the glass-crystalline substrate with an etchant solution to form the one or more depressions or through holes for electrical conduction in the device. in addition the present method includes coating at least a portion of the device with metal or alloys, metal-nanoparticles, alloy nanoparticles, metal inserts, alloy inserts, noble metals or a combination thereof or polymers and/or coating at least a portion of the one or more holes with one or more metals, polymers or a combination thereof. The etched features occur at different elevations on the material and/or several layers can be attached together to form a larger system.

The present invention also provides a method to fabricate a device with microfluidics for in-package cooling by preparing a photosensitive glass substrate comprising at least silica, lithium oxide, aluminum oxide, and cerium oxide; masking a design layout comprising an inlet and an outlet connected by one or more microfluidic channels for transport of a fluid on the photosensitive glass substrate; exposing at least one portion of the photosensitive glass substrate to an activating energy source; exposing the photosensitive glass substrate to a heating phase of at least ten minutes above its glass transition temperature; cooling the photosensitive glass substrate to transform at least part of the exposed glass to a crystalline material to form a glass-crystalline substrate; and etching the glass-crystalline substrate with an etchant solution to form an etched design layout comprising the inlet and the outlet connected by the one or more microfluidic channels to transport the fluid on the glass-crystalline substrate.

The activating energy source includes as ultraviolet light, a directed source of protons using an activation exposure of 0.1-36 J/cm$^2$ or a combination thereof. The present invention may also include compressing a second glass-crystalline substrate to the glass-crystalline substrate into a multilayer glass-crystalline substrate and baking the multilayer glass-crystalline substrate to form a bonded multilayer crystalline, non-crystalline, or a combination of the two states substrate.

The present invention includes a method to fabricate a substrate with one or more optical wave guides by preparing a photosensitive glass substrate comprising at least silica, lithium oxide, aluminum oxide, and cerium oxide; forming one or more metal vias in the photosensitive glass substrate; masking a design layout comprising an inlet and an outlet connected by one or more paths oriented within the photosensitive glass substrate; exposing at least one portion of the photosensitive glass substrate to an activating energy source; exposing the photosensitive glass substrate to a heating phase of at least ten minutes above its glass transition temperature; cooling the photosensitive glass substrate to transform at least part of the exposed glass to a crystalline material to form a glass-crystalline substrate; and etching the glass-crystalline substrate with an etchant solution to form an etched design layout comprising the one or more paths in optical communication with the one or more metal vias to transport and reflect the light in the substrate.

BRIEF DESCRIPTION OF THE DRAWINGS

For a more complete understanding of the features and advantages of the present invention, reference is now made to the detailed description of the invention along with the accompanying figures and in which:

FIGS. 4A-4C are images that demonstrate some of the capabilities of APEX™ Glass ceramics as it pertains to microfluidics;

FIGS. 5A and 5B are images of microfluidic designs include a straight line design and a serpentine design;

FIGS. 6A-6C is an image of placing microposts on the bottom of the microchannel the amount of heat transfer can be increased;

FIG. 7A is an image of a quartz/chrome mask containing a variety of arcs with different angles and lengths and FIG. 7B is an image of reflection of light by angling it against a copper plated via to reflect light down an alternative path in the adjacent glass;

DETAILED DESCRIPTION OF THE INVENTION

Figure 1:
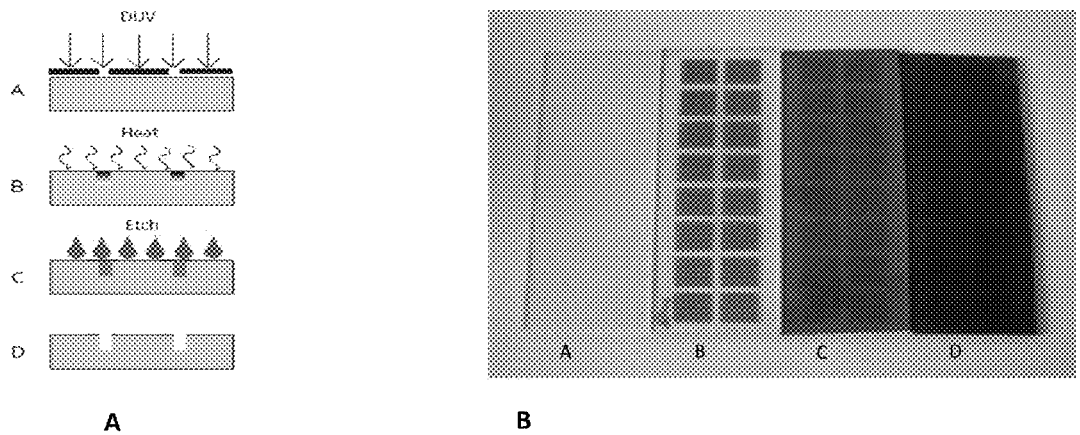
FIG. 1A is a schematic of the processing steps for making structures in the glass ceramic of the present invention.
FIG. 1B is an image of the different states of APEX™ glass ceramic processing.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not restrict the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

To address these needs, the present inventors developed a glass ceramic (APEX™ Glass ceramic) as a novel packaging material for semiconductors. APEX™ Glass ceramic is processed using first generation semiconductor equipment in a simple three-step process and the final material can be fashioned into either glass, ceramic, or contain regions of both glass and ceramic. The APEX™ Glass ceramic possesses several benefits over current materials, including: easily fabricated high density vias, demonstrated microfluidic capability, high Young's modulus for stiffer packages, halogen free manufacturing, and economical manufacturing.

Photoetchable glasses have several advantages for the fabrication of a wide variety of microsystems components. Microstructures have been produced relatively inexpensively with these glasses using conventional semiconductor processing equipment. In general, glasses have high temperature stability, good mechanical properties, are electrically insulating, and have better chemical resistance than plastics and many metals. To our knowledge, the only commercially available photoetchable glass is FOTURAN®, made by Schott Corporation and imported into the U.S. only by Invenios Inc. FOTURAN® comprises a lithium-aluminum-silicate glass containing traces of silver ions. When exposed to UV-light within the absorption band of cerium oxide the cerium oxide acts as sensitizers, absorbing a photon and loosing an electron that reduces neighboring silver oxide to form silver atoms, e.g.,

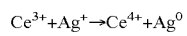

$$Ce^{3+}+Ag^+ \rightarrow Ce^{4+}+Ag^0$$

The silver atoms coalesce into silver nanoclusters during the baking process and induces nucleation sites for crystallization of the surrounding glass. If exposed to UV light through a mask, only the exposed regions of the glass will crystallize during subsequent heat treatment. This heat treatment must be performed at a temperature near the glass transformation temperature (e.g., greater than 465° C. in air for FOTURAN®). The crystalline phase is more soluble in etchants, such as hydrofluoric acid (HF), than the unexposed vitreous, amorphous regions. In particular, the crystalline regions of FOTURAN® are etched about 20 times faster than the amorphous regions in 10% HF, enabling microstructures with wall slopes ratios of about 20:1 when the exposed regions are removed. See T. R. Dietrich et al., "Fabrication technologies for microsystems utilizing photoetchable glass," Microelectronic Engineering 30, 497 (1996), which is incorporated herein by reference.

Preferably, the shaped glass structure contains at least one of a micro-optic lens, a micro-optic micro-post, and a micro-channel or micro-ridge micro-optic waveguide. The micro-ridge, optical waveguide may be formed by etching away exposed glass to leave a glass micro-ridge such that light is guided by the micro-ridge. The micro-ridge may be formed with a layer of photosensitive glass overlying a layer of non-photosensitive glass of lower index of refraction than the photosensitive glass, to substantially prevent light being guided by the micro-ridge from leaving the bottom of the micro-ridge in at least one portion of the micro-ridge. In some embodiments, a surface-smoothing acid containing at least one of nitric acid to dissolve surface metallic silver and hydrochloric acid to dissolve surface cerium metal is used during or after the HF etch, whereby surface roughness of at least one micro-optic device in the shaped glass structure is reduced and whereby light transmission through surfaces of a micro-optic device is increased.

FOTURAN® is described in information supplied by Invenios (the sole source U.S. supplier for FOTURAN®) is composed of silicon oxide ($SiO_2$) of 75-85% by weight, lithium oxide ($Li_2O$) of 7-11% by weight, aluminum oxide ($Al_2O_3$) of 3-6% by weight, sodium oxide ($Na_2O$) of 1-2% by weight, 0.2-0.5% by weight antimonium trioxide ($Sb_2O_3$) or arsenic oxide ($As_2O_3$), silver oxide ($Ag_2O$) of 0.05-0.15% by weight, and cerium oxide ($CeO_2$) of 0.01-0.04% by weight.

As used herein the terms "APEX™ Glass ceramic", "APEX glass" or simply "APEX" is used to denote one embodiment of the glass ceramic composition of the present invention.

The present invention provides a single material for denser packaging with imbedded optical waveguides, and cooling. Packaging is the final manufacturing step in semiconductor processing, transforming semiconductor parts into saleable devices. Unfortunately, today's packaging has become the limiting element in system cost and performance for IC development. As packaging enables consumer control (directly and indirectly) of electrical connections, signal transmission, power inputs, and voltage control. As the traditional Moore's Law scaling has become more and more difficult, innovation in packaging is expected to provide similar scaling in performance and cost. Assembly and packaging technologies have become primary differentiators for manufactures of consumer electronics and the push for small IC products.

Applications of the present invention reduce form factors and include cellular phones, digital video camcorders, and notebook PCs among others. Traditional packaging approaches to address the needs in these "High Density Portable" devices, e.g., FR4, liquid crystal polymers, and Low Temperature Co-Fired Ceramics (LTCC), running into fundamental material limitations (e.g., packaging layer thinness, high density interconnect capability, thermal management, and optical waveguiding). APEX™ Glass is a photo definable glass-ceramic. APEX™ Glass ceramic is process using first generation semiconductor equipment in a simple three step process and the final material may be either glass, ceramic, or contain regions of both glass and ceramic.

Generally, glass ceramics materials have had limited success in microstructure formation, they have been plagued by performance, uniformity, usability by others and availability issues. Legacy glass-ceramic options produced maximum etch aspect-ratios of approximately 15:1 in contrast APEX glass has an average etch aspect ratio greater than 50:1. This allows users to create smaller and deeper features. Additionally, our manufacturing process enables product yields of greater than 90% (legacy glass yields are closer to 50%). Lastly, in legacy glass ceramics, approximately only 30% of the glass is converted into the ceramic state, whereas with APEX™ Glass ceramic this conversion is closer to 70%. This translates into the faster, more precise, etching of ceramic features.

Surprisingly, it was found that the compositions of the present invention may at first glance appear to be similar to FOTURAN®; however, there are dramatic differences with the compositions of the present invention. for example, the instant invention demonstrated a surprising sensitivity to ultraviolet light exposure of over three times that of the commercially available photosensitive glass, and yielded up to six times the etch rate more compared to FOTURAN® when both compositions were processed in the way recommended for FOTURAN® (with the exception of the reduced exposure and bake temperature used for APEX due to its greater sensitivity and lower glass transformation temperature). Further, APEX glass had an etch ratio of exposed portion to that of the unexposed portion of at least 30:1 to 40:1, while the best reported etch ratio of the commercially available FOTURAN® photosensitive glass exposed with a broad spectrum mid-ultraviolet flood lamp is about 20:1.

Not wanting to be bound by theory, it is believed that changes in the APEX composition provides three main mechanisms for its enhanced performance: (1) The higher amount of silver leads to the formation of smaller ceramic crystals which are etched faster at the grain boundaries, (2) the decrease in silica content (the main constituent etched by the HF acid) decreases the undesired etching of unexposed material, and (3) the higher total weight percent of the alkali metals and boron oxide produces a much more homogeneous glass during manufacturing. This facilitates more consistent performance across the substrate over large distances—but in any case, the results are surprising.

Kravitz et al. (U.S. Pat. No. 7,132,054), suggests that an even less expensive method of fabricating the microneedles is to replicate them using a negative mold made from the original glass hollow microneedle array structure, as follows: "A negative mold can be made by depositing a mold material onto the glass hollow microneedle array. For example, a negative mold of FOTURAN®. Microneedles can be made by electroplating a metal (e.g., nickel, copper, or gold) onto a sputtered seed layer deposited on the FOTURAN® microneedles. After the negative plated mold is created and released from the glass array, a liquid polymer, such as Zeonor 1020R, can be cast into the mold. After the Zeonor 1020R is cooled and solidified, the polymeric hollow microneedle array can be easily peeled off the plated negative mold and the mold can be re-used. Other plastics that can be hot embossed or injection molded, such as polycarbonate, can also be used." Such an approach can be improved by using APEX. Alternatively, a negative mold can be made directly of the photoetchable glass, as shown in U.S. Pat. No. 7,132,054. A similar process can be used with the glass ceramics of the present invention as such U.S. Pat. No. 7,132,054 is hereby incorporated by reference.

The present invention provides a single material approach for the fabrication of microstructures with photodefinable/photopatternable glass ceramics (GCs) for use in ultra fine plated through holes for conduits for electrical/electron movement; semiconductor placed (e.g. thermal evaporation, sputter, etc.) electrical lines; microfluidics for on-chip/in-package cooling and fluid movement and operate on a high pressure or low pressure based. The architecture may also be optical wave guiding for optoelectronic devices or optical interrogation of a sample that can include the shaped GC structures that are used for lenses and includes through-layer or in-layer designs. The present invention can also provide cut outs within layers for embedded devices between layers, such as imbedded passive devices or fluidic reservoirs.

Figure 2:
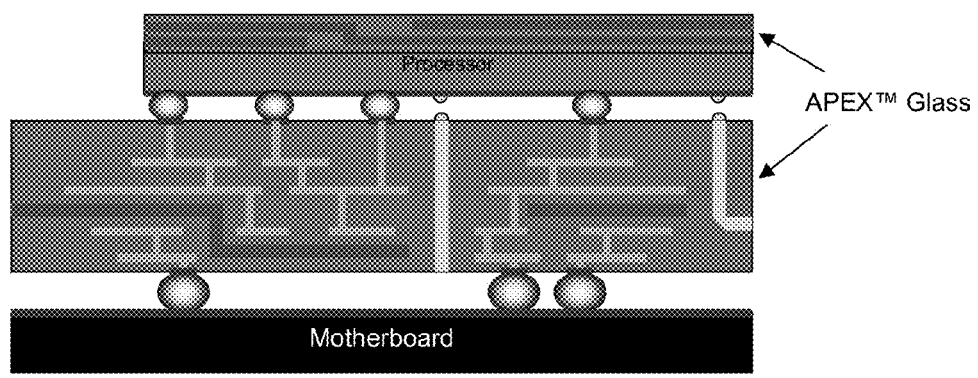
FIG. 2 is a schematic of the platform for microprocessors/semiconductor processing where a CPU chip may be mounted to an GC device that contained ultra fine plated through holes for electrical conduction from CPU to the external components of the device, microfluidics for in-package cooling, optical wave guides for optoelectronic computing, and/or imbedded passive devices.

FIG. 1A is a schematic of the processing steps for making structures in APEX™ Glass ceramic. FIG. 1B is an image of the different states of APEX™ Glass ceramic processing. FIG. 1B illustrates (A) unprocessed, (B) with imbedded microstructures processed (in this case an array of microwells), (C) after secondary nucleation for full chip ceramicization, and (D) fully formed ceramic part with imbedded microstructures (microwells). The present invention provides devices, parts and structures (entirely or in-part) that are either wholly glass, wholly ceramic, wholly precipitated nucleating agent (e.g., gold, silver, copper, etc), or contain regions of mixtures thereof. FIG. 2 is an image of a device that is glass (A), contain regions of two or more of the following:

glass, ceramic, or precipitated nucleating agent (B), wholly precipitated nucleating agent (e.g., gold, silver, copper, etc) (C), or wholly ceramic (D). APEX™ GC would be an example of a photo-definable glass ceramic. As such, the present invention provides a platform for microprocessors/semiconductor processing where a CPU chip may be mounted to an APEX™ GC device that contained ultra fine plated through holes for electrical conduction from CPU to the external components of the device, microfluidics for in-package cooling, optical wave guides for optoelectronic computing, and/or imbedded passive devices. Additionally, this approach may be used for other SiP, PoP, PiP, and SoC stack structures. As illustrated in the FIG. 2.

In addition to semiconductor applications, the present invention can be used to form microfluidic channels, created to withstand ultra high pressures (>10,000 psi) to be used for chip-based HPLC. The microfluidics of the present invention may be packed with microspheres and be used for analyte separation. Furthermore, the whole system may be fully or partially ceramicized. In the fully ceramicized example it may contain a small window of glass (e.g., an optical wave guide) surrounded by ceramic for optical viewing into the channel. Other embodiments of the instant invention use the architecture features disclosed herein without the use of the electronics portion in non-semiconductor packaging design, e.g., HPLC design.

In any of the embodiments herein, the electron conduction elements can be of any metal (such as gold, platinum, and copper) and alloys or mixtures thereof can be incorporated through a variety of methods including electroless plating, electroplating, thermal evaporation, sputtering, or epoxy. In some embodiments, other conductive mediums (e.g., conductive polymers or conductive diamond) may be used.

The present invention provides many benefits including a semiconductor approach to packaging manufacturing, improved planarity with reduced or low warpage at higher process temperatures due to increased glass transition temperature (Tg) and modulus, low moisture absorption, increased via density in substrate core, alternative plating finish for improve reliability, a solution for interconnect density scaled to silicon (Si I/O density increases faster than package substrate technology), Tg compatible with Pb-free solder processing including rework at 260° C., thermal dissipation and heat management. For example, the heat transfer rate in fully ceramicized parts measured a 10% better than glass parts.

In addition, the ceramicized APEX™ GC of the instant invention provides many benefits not seen with borosilicate, e.g., thinner package sizes to fit into thinner-demanded electronics, continuation of the Moore's law-like advancement in semiconductors, higher operating temperature for processors, halogen free, No need for fire-retardant coatings, no need for UL-94 qualification (i.e., the parts will no longer be plastic), better at higher frequencies, more consistent dielectric constant, the ability to produce numerous structures (e.g., vias, optics, channels) simultaneously, does not require costly and slow CNC milling, provides higher aspect ratio of through holes (>50:1 vs. 8:1) compared to FR4, provides better and smaller through hole diameters and pitches, the present invention may be engineered to be radiation hard glass-ceramic and provide a more controllable manufacturing process with final products with portions that are optically transparent surrounded by non-transparent ceramic.

The present invention provides a method of IC packages made out of ceramics (e.g., LTCC and HTCC) plastics (e.g., liquid crystal polymers) and hybrid organic materials (e.g., FR4). APEX™ Glass ceramic and other GCs have certain properties that are ideally suited for future packaging applications such as: Tg, Modulus, semiconductor processing, and advanced engineering features (e.g., waveguiding, microfluidics, through hole density).

The present invention provides numerous methods of processing. For example, one embodiment has a process using APEX™ GC but not limited thereto. The present invention provides a single feature or serial feature microfabrication that includes exposing features into a raw GC substrate with 310 nm light, baking the parts and convert regions previously exposed into ceramic. The parts are etched in dilute HF acid to obtain a final 3D structure. Each layer is processed accordingly. In the case of serial processing, other features on previously processed layers are created in this step by the following steps. For example, the first processing would be through holes for high d. The layers are then exposed to 310 nm light with no mask. Alternatively, the regions are exposed, except regions with the wave guides (e.g., glass surrounded by precipitated nucleating agent or ceramic are to remain) to 310 nm light. The layers are aligned to form a complete device, baked and ceramicized all layers together. Alternatively, this process may be done separately (e.g., ceramicize then bond) or it can be done at the same time (e.g., ceramicized and bond).

In another embodiment, multiple features are processed in parallel microfabrications. The raw GC substrate features are expose with 310 nm light (#1 exposure). The parts are baked and regions previously exposed are convert into ceramic. These features are used to expose a second set of features (#2 exposure). The parts are etched to create a #1 exposure, which is then bake to convert the #2 exposure parts into ceramics. The etch #2 exposed parts can be a partial etch for things like microfluidics, or can be a through etch. All of the layers are exposed to 310 nm light with no mask. Alternatively, all of the regions, except regions where wave guides is formed is exposed (e.g., glass surrounded by precipitated nucleating agent or ceramic are to remain). The device is aligned to make a complete part that can then be baked and ceramicized to form a single layer. This can be done separately (e.g., ceramicize then bond) or it can be done at the same time (e.g., ceramicized and bond).

In another embodiment, the features and benefits of the material can be achieved through a deposition method. For example, the core photodefinable glass may be deposited via CFD, ionic plasma deposition, or other surface coating methods, to a compatible substrate and yield similar capabilities. Additionally, a sol-gel processed GCs may be used for this purpose. There may be an annealing steps if needed where the GC final product is annealed at T>Tg for a several hours. This would create a better ceramic and increase the bonding strength of the previously bonded layers based on the formation of crystallized structure versus the amorphous glass phase of the GC.

In addition, bonding may occur through a variety of methods. The principle idea is that semiconductor packages require several layers (i.e. 4-8 layers) to get the pin-outs from the computer chip to the outside world. Bonding may be done through anodic bonding, fusion bonding, or other methods and may possess anywhere from 2-30 different layers. Each layer may be a different thickness if needed. Coating of individual layers for bonding. For a perhaps more efficient bonding method, layers may be bonded together using an intermediary spin-on adhesive, such as photoresist, and silane chemistries, as well as a variety of epoxies. A second layer may then be added to this first layer. This intermediary layer may then be reheated to re-flow the adhesive and bond the two layers together.

Figure 3:
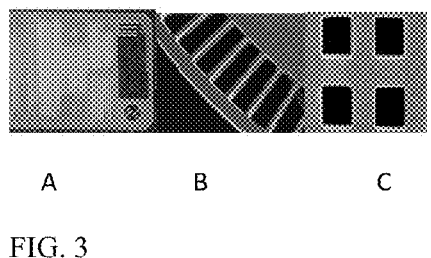
FIGS. 3A, 3B and 3C are schematics of the glass ceramic represents a single material capable of being used for optical waveguides, imbedded microfluidics, and ultra-fine printed through-holes.

FIGS. 3A, 3B and 3C are schematics of the APEX™ glass ceramic represents a single material capable of being used for optical waveguides, imbedded microfluidics, and ultra-fine printed through-holes. Insert: APEX™ Glass ceramic used for FIG. 3A is a photo of microfluidics, FIG. 3B is a photo of 75 µm square vias in 1.0 mm thick glass and FIG. 3C is a photo of 100×300 µm rectangular vias in 0.5 mm thick glass, with 20 µm ribs separating vias.

APEX™ Glass ceramics of the present invention is ideally suited for the CPU and System in the package (SiP) markets. Generally, central processing unit manufacturers currently use FR4 (Flame Retardant 4) as the core material in packaging approaches. FR4 packages are produced using expensive CNC drills, where one hole at a time is produced for high-density interconnects. This process is costly, slow, requires large capital investment, and is limited in interconnect density. Similarly, SiP applications typically use LTCC and plastics. Both of these materials are limited by interconnect density, Young's Modulus, and shrinkage problems among others. However, in all three cases of these traditionally used packaging materials, none represent a single material capable of being used for high density interconnects, thermal management (via microfluidics) and optical waveguides. APEX™ Glass ceramic of the present invention is ideally positioned to be a better core material than FR4, LTCC, and plastics, while enabling these three key in-package design elements as illustrated in the table below:

utes to higher interconnect latency, higher power dissipation, lower bandwidth, and higher interconnect losses. APEX™ Glass ceramic of the present invention is currently used for the production of microfluidics for biological and chemical reactions and thus provides a ready reference product for in-package microfluidic cooling.

Furthermore, the APEX™ glass ceramic of the present invention has the ability to create microstructures of optically transparent glass surrounded by non-transparent ceramic. These glass waveguides can be produced either vertically or horizontally within multi-layer packages. In the processing of waveguides areas of reduced index of refraction (ceramic) surround areas of increased index of refraction (glass). The intermediate integration of optoelectronic devices onto packaging structures will address the key bottleneck of low-latency, high-bandwidth, and high density off-chip interconnects.

The IC and packaging industry have been moving towards "green" packaging materials to meet the Reduction of Hazardous Substances directive (RoHS, European Union Directive). One of the biggest concerns has centered around halogen containing substrates, and in particular FR4. FR4 is made with halogen elements and when it catches on fire can produce toxic gasses. APEX™ Glass ceramic is produced with zero halogen containing ingredients. Additionally, because the material is a glass ceramic, it does not need to meet UL94 requirements (which pertains only to plastic materials).

| | Metric | APEX ™ Glass | FR-4 | LTCC[1] | Plastic[2] |
|---|---|---|---|---|---|
| 1 | Thermal expansion | 9 ppm/K | 15 ppm/K | 5.9-10 ppm/K | 3-12 ppm/K |
| 2 | Dielectric constant | 5.7 | 4.7 | 5.9-7.9 | 2.9-3.9 |
| 3 | Tg | 450 C. | 110-200 C. | N/A | N/A |
| 4 | Young's Modulus | 78 GPa | 17 GPa | 12-27 GPa | N/A |
| 5 | Manufacturing method | Semiconductor based | CNC drilled | Screen printing | Screen printing, CNC |
| 6 | Minimum through hole size | <10 microns | 100 microns | 75-100 microns | N/A |
| 7 | Material thickness | <100 microns | 400 microns | <100 microns | N/A |
| 8 | Transparent | >90% 370-2300 nm | No | No | No |
| 9 | Imbedded cooling | Yes | No | Yes | N/A |
| 10 | In package optics | Yes | No | No | No |
| 11 | Halogen Free? | Yes | No | Yes | Yes |
| 12 | Radiation hard? | Potentially | No | No | No |

I. Scrantom, C.Q., "LTCC Technology: Where we are and where we're going - IV", June 2000, www.seaceramics.com/Download/Papers/ltcc00v4.pdf.
II. "Liquid Crystal Polymer (LCP) LDMOS Packages", Quantum Leap, 2004, www.mlconnelly.com/QLPKG/Final_LDMOS_DataSheet.pdf.

APEX™ Glass ceramic's of the present invention provides mechanical advantages, as seen in, metrics 4-7 in the table above, which shows four key metrics where APEX™ glass ceramic has the potential to lead to smaller, more rigid, and cheaper packages. The Young's Modulus is approximately three times higher than LTCC. This enables the reliable manufacturing of thinner packages without the risk of package warp or bending. This reduced Z-direction thickness would enable production of thinner consumer electronic devices with less waste. APEX™ Glass ceramic of the present invention may be produced using traditional glass manufacturing methods, such as large ingot casting for wafering, tin float processes similar to those used to make windows, and down-draw processes similar to those used to make microscope cover slips and flat panel display glass.

The present invention allows the design of cooling and optical waveguides. Cooling is currently accomplished by air-cooled heat sinks Today's cooling methods rely upon large thermal mass heat sinks. These devices limit the chip packing density, and increase wiring length, which contrib- While the APEX™ Glass ceramic of the present invention is processed with hydrofluoric acid, only dilute amounts (5%) are used, and etchants solutions may be used for weeks at a time.

The APEX™ Glass ceramic of the present invention may be used in optoelectronic, MEMS, medical, nanotechnology, and biological applications among others and can withstand inexcess of 1500 psi. In optical wave guiding applications of APEX™ Glass ceramic, an array of glass arcs fully surrounded by ceramic provide the travel angles ranging from 0° to 15°, and arc-lengths ranging from 1-3 centimeters.

The APEX™ Glass Ceramic of the present invention is photo-definable and allows areas exposed to deep ultraviolet light to be transformed into a ceramic during a baking and etching process. The resultant ceramic is fifty times more soluble in hydrofluoric acid than the surrounding glass. The increased solubility of the exposed regions allows very small feature sizes (>10 µm) and high etch aspect features (ratios >50:1) to be achieved. Currently, APEX™ Glass ceramic is produced in standard wafer formats, similar to silicon wafers, and use lower capital expenses ($25K vs. over $1MM) compared to similar micromachining processing, such as LIGA or BOSCH processing. These two advantages enable LBSI to leverage cost-effective semiconductor processing methods to achieve low part cost points.

The present invention provides a process to form a wide variety of microfluidic components. These components have mostly focused on chemical and biological reactions. FIGS. 4A-4C are images that demonstrate some of the capabilities of APEX™ Glass ceramics as it pertains to microfluidics. FIG. 4A is images that demonstrate a serpentine microfluidic reactor with 200 and 100 μm wide microfluidic channels. FIG. 4B is images that demonstrate a side profile of 100 by 50 μm microfluidic channels made in all-ceramic APEX™ Glass ceramic. FIG. 4C is images that demonstrate an SEM of 6, 500 μm thick layers of APEX™ Glass ceramic fusion bonded together. In contrast, cooling is currently accomplished by air-cooled heat sinks, but due to projected junction temperatures, air cooling will need to be replaced in a couple of years. Today's cooling approaches rely upon large thermal mass heat sinks. These devices limit the chip packing density thereby increasing wiring length, which contributes to higher interconnect latency, higher power dissipation, lower bandwidth, and higher interconnect losses. The ITRS Roadmap projects power densities to be >100 W/cm$^2$ and junction-to-ambient thermal resistance to be <0.2° C./W for high-performance chips in the 14 nm generation.

A major consideration is the thermal management of hot spots. Even when the total power of the IC remains unchanged, hot spot may develop and limit the performance of the IC. In both of these circumstances microfluidics are a solution for thermal management, either by continuous cooling and/or by the programming and tailoring of cooling regiments for hot spots. The present invention addresses these problems, e.g., using a five layer stack of APEX™ Glass ceramic where three layers are used for microfluidic plumbing throughout the package and two layers are used for caps (e.g., top and bottom).

In addition, the design elements or architecture of the design elements can be designed in various ways. For example, three 150 μm thick layers of APEX™ Glass ceramic can be patterned using 310 nm light with a quartz/chrome test mask at an energy density of 10 J/cm$^2$. Parts are be baked with the prescribed schedule of: Stage 1, 500/6/15 (temperature in C/ramp in C per min/time in minutes) and Stage 2, 560/3/15 (temperature in C/ramp in C per min/time in minutes). Next, the parts will be etched in a 5% HF acid solution in a sonication tank. Once all five layers have been processed into their respective layers, they will all be exposed to 20 J/cm$^2$, stacked and compressed under 2 PSI, and baked at 560/6/20 (temperature in C/ramp in C per min/time in minutes) to simultaneously convert them into fully ceramicized parts and bond them together. The present invention provides device capable of withstanding 1500 PSI or more.

The microfluidic systems with APEX™ Glass ceramic designed for an electronic package represents unique features including tight features in close proximity to each other and surrounding electronics, and a strong bond strength capable of withstand high fluid pressures as systems may be integrated with refrigerated liquids or super cooled liquids (e.g., Sterling engine) and their liquid-gas conversion would create very high pressures). The quartz/chrome mask is designed to posses a variety of basic microfluidic designs. These include a basic straight line with single in and single out and a serpentine pattern. Secondary design elements focus on different line widths (ranging from 25-100 μm), spacing between microfluidic lines (ranging from 100-500 μm), and side fluidic entry or top/bottom fluidic entry. For example, FIGS. 5A and 5B are images of microfluidic designs include a straight line design and a serpentine design.

In general, the amount of heat transfer can be measured by placing the microfluidic device onto a hot source (e.g. hot plate). Different temperatures of water (or another coolant) will be pushed through the microfluidic channel and the amount of heat removed can be calculated based upon the temperature difference measured at the hot plate surface and the top surface of the microfluidic chip. In addition, the present invention provides the use of microposts for in-channel heat sinks and cooling and a series of microposts in the bottom of the microfluidic channel may also be used The positioning of hundreds of microposts inside the microchannel increases the amount of surface area between the hot source (e.g., the package) and the coolant. By creating microposts on the bottom of the microchannel the surface area interaction between the hot source and the coolant is increased by a factor of at least 7.5. For example, as seen in FIGS. 6A-6C by placing just 42 microposts on the bottom of the microchannel the amount of heat transfer can be increased. FIG. 6A is an image of micropost fabrication in APEX™ Glass ceramic. FIG. 6B is a schematic of the surface area of microchannel that is 0.1 mm$^2$. FIG. 6C is a schematic of adding 20 μm diameter, 50 μm tall microposts into the microchannel to increase the surface area by 7.5 times.

In one embodiment the instant invention provides a wholly ceramic serpentine device with channel-to-channel spacing of less than 300 microns, and channel features less than 100 microns wide, and approximately 50 μm deep. This device must be capable of withstanding over 1500 PSI in a water pressure test without in-channel microposts and with and without metal coatings. State of the art interconnects in today's packages are approximately 100-175 μm in diameter, depending upon packaging material; however, the microfabricating of the present invention provides a variety of interconnect diameters (e.g., 10, 20, 40, 60, 80, and 100 micron diameter) interconnects and interconnect pitches (center-to-center) (e.g., 0.6, 0.7, 0.8, 0.9, and 1.0 times) interconnect diameter for all interconnect diameters. In addition, interconnect plating serves as a method of electrically connecting the top of a package layer to the bottom of a package layer, e.g., placing copper onto the surface and into interconnects of APEX™ Glass ceramic: copper deposition via electroplating and electroless plating methods.

After interconnects have been made within samples of APEX™ Glass ceramic, both sides of the parts are be coated with about 200 angstroms of chrome and about 1200 angstroms of copper via thermal evaporation. The skilled artisan will readily understand that other thicknesses (e.g., 5-2000 angstroms) of metal and various metal and or alloy compositions can be used.

One electroplating system for interconnect coatings that can be used is a LPKF Contact-RS system that uses reverse-pulse electroplating to produce smooth interconnect wall plating without creating copper over-plating. The LPKF system is capable of plating up to 6 layers. Another system is an electroless plating that is a cost effective way of plating copper without electronic controls and is generally used for copper deposition in interconnect plating.

The present invention provides a process to form devices such as vias and microfluidic channels are simultaneously microfabricated in a fast and cheap process. The first step involves patterning an APEX™ Glass ceramic wafer using standard contact photolithography processes with a quartz/chrome mask to create the desired pattern. The wafer is then exposed to mid ultraviolet light. During this step, photo-activators in the glass become reduced. In the second step of the process, the wafer is baked in a two-step process. First, the temperature is raised to a level that allows the photo-activators to migrate together forming nano-clusters. A second temperature ramp is employed to facilitate lithium ions in the glass matrix to coalesce around the previously formed nano-clusters. During this step of the baking process, the exposed regions are converted into a ceramic. In the final step, the wafer is etched in a hydrofluoric solution creating posts, wells, vias, or other desired features. The desired structure height/depth can be controlled via etch concentrations and processing duration. Once the desired structures have been created the whole system can be converted into ceramic by exposing and baking the entire part.

In addition, the present invention provides a method of forming optical wave guiding in APEX™ Glass ceramic. The glass ceramic of the present invention is unique in that even when the final product is in the ceramic state, it may contain specified regions of glass. This glass may transverse along a layer as well as through several layers. This aspect is accomplished with one slight modification to previously described ceramicization protocols. Above, ceramicization of the glass is accomplished by exposing the entire glass substrate to approximately 20 J/cm$^2$ of 310 nm light. When trying to create glass spaces within the ceramic, users expose all of the material, except where the glass is to remain glass.

In one embodiment, the present invention provides a quartz/chrome mask containing a variety of arcs with different angles and lengths (as seen in FIG. 7A). The angles of these arcs can range from 0-15° (or 1-90°) and increase by 1° or more increments. Lengths of these arcs are be 1, 2, and 3 cm but can be any length necessary. In addition to arcs, the present invention provides for the strategic placement of copper plated vias directly adjacent to orthogonal and angled straight lines. FIG. 7B is an image of reflection of light by angling it against a copper plated via to reflect light down an alternative path in the adjacent glass. In these embodiments the plated vias act as mirrors for incoming light to dramatically change the angle (>45°) of light movement. The optical waveguide chips can be fabricated out of 1.0 mm thick APEX™ Glass ceramic and have channel widths of 300 and 600 microns, again different widths can be used, e.g., 0-300 or 600 or more microns. Although almost any light wavelength may be used (e.g., 1-1000 nm) some specific sources include LEDs at approximately 500 nm, 600 nm and 750 nm.

FIGS. 8A-8D are schematics of the processing of making high-precision glass micromachined structures with etch ratios of 30:1 to 50:1 of the present invention. FIG. 1A is an illustration of the substrate 10 that is partially covered by the mask 12 and treated with an emissions radiation 14. The emissions radiation 14 may be of a variety of types including mid-ultraviolet radiation from a mid-ultraviolet flood exposure system or laser emission from a laser-based exposure system. For example, the emission may be approximately 308 to 312 nm; but the skilled artisan will recognize that other wavelengths (50-100, 100-150, 150-200, 200-250, 250-300, 300-400, 400-500, 500-600, 600-700, 700-800, 800 nm or above) may be used.

Figure 8:
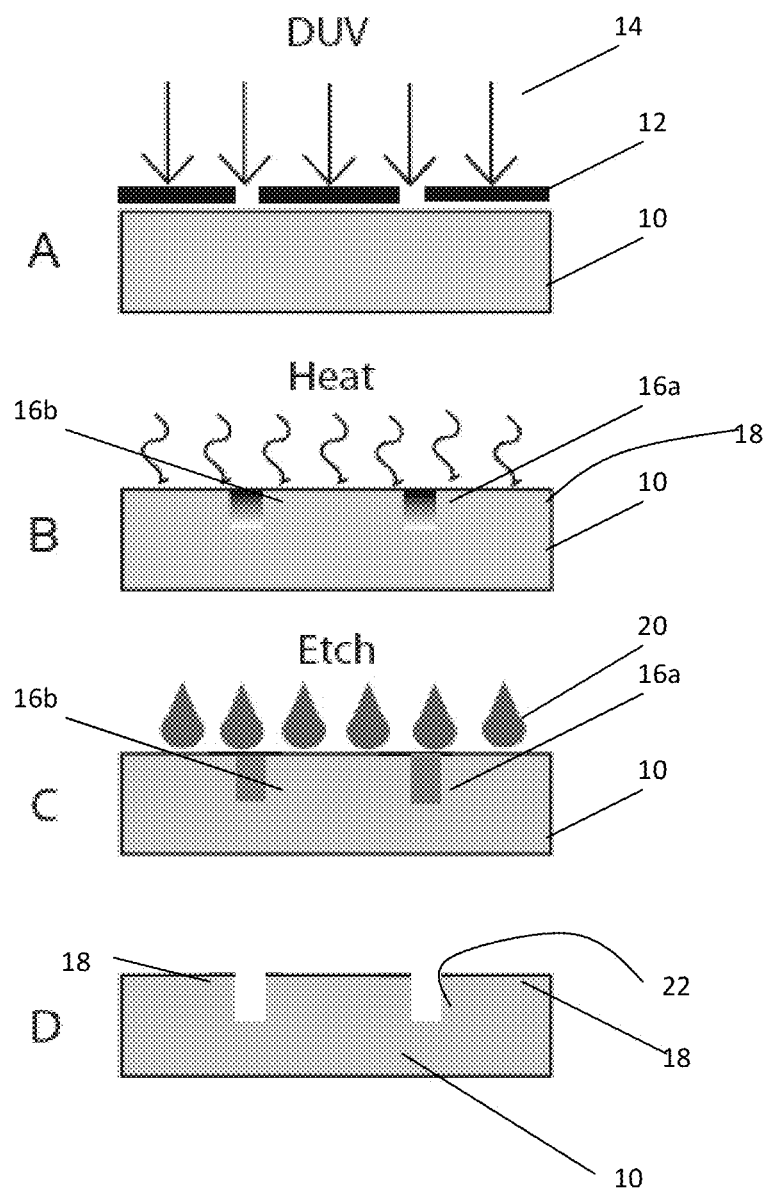
FIGS. 8A-8D are schematics of the processing of making high-precision glass micromachined structures of the present invention.

FIG. 8B is an illustration of the substrate 10 that has been partially covered by the mask (not shown) and treated with an emissions radiation (not shown) to produce exposed areas 16A and 16B and unexposed areas 18. The substrate 10 is then heated to a temperature near the glass transformation temperature to transform at least part of the exposed glass to a crystalline material.

FIG. 8C is an illustration of the substrate 10 treated with an etching solution. The substrate 10 includes crystalline material regions 16A and 16B and unexposed regions 18. The substrate 10 is treated with an etchant 20 to etch the crystalline material regions 16A and 16B. The etching process results in etch ratio of exposed portion to that of the unexposed portion is at least 30:1 when exposed with a broad spectrum mid-ultraviolet flood light, and greater than 30:1 when exposed with a laser, to provide a shaped glass structure with an anisotropic-etch ratio of at least 30:1. In some embodiments, the etchant 20 is HF, in some embodiments the etchant 20 is a combination of HF and additional ingredients, such as hydrochloric acid or nitric acid.

FIG. 8D is an illustration of the substrate 10 treated with an etching solution to remove the crystalline material regions (not shown) to leave the etched areas 22A and 22B in the unexposed regions 18.

Figure 9A:
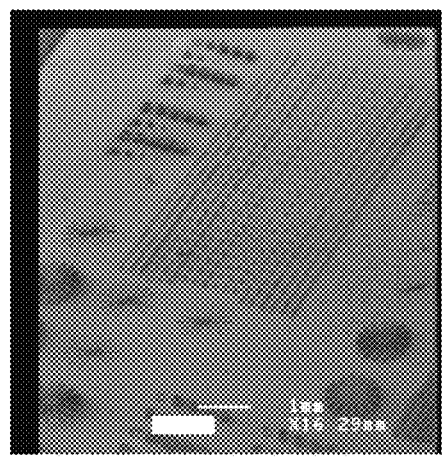
FIGS. 9A-9B are Field Emission Microscopy (FEM) images of the high-precision glass micromachined structures of the present invention.
Figure 9B:
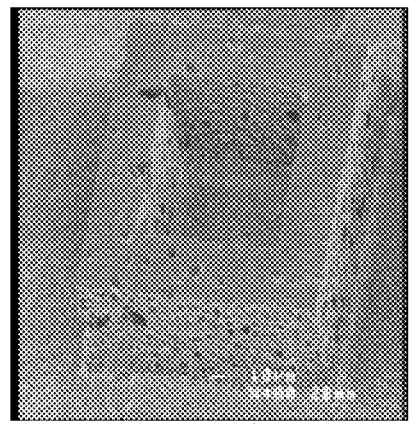
Figure 10A:
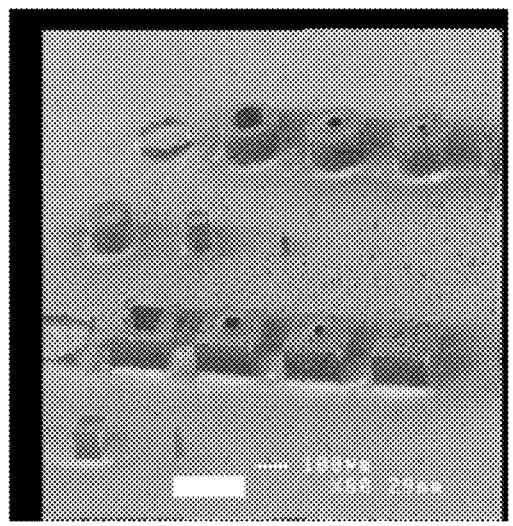
FIGS. 10A-10D are FEM images of the high-precision glass micromachined structures of the present invention.
Figure 10B:
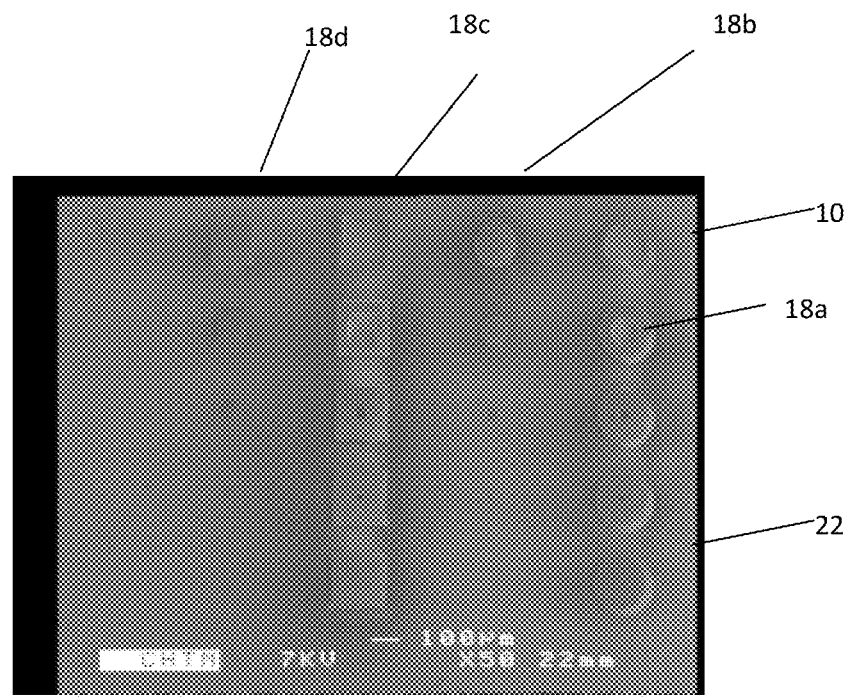
Figure 10C:
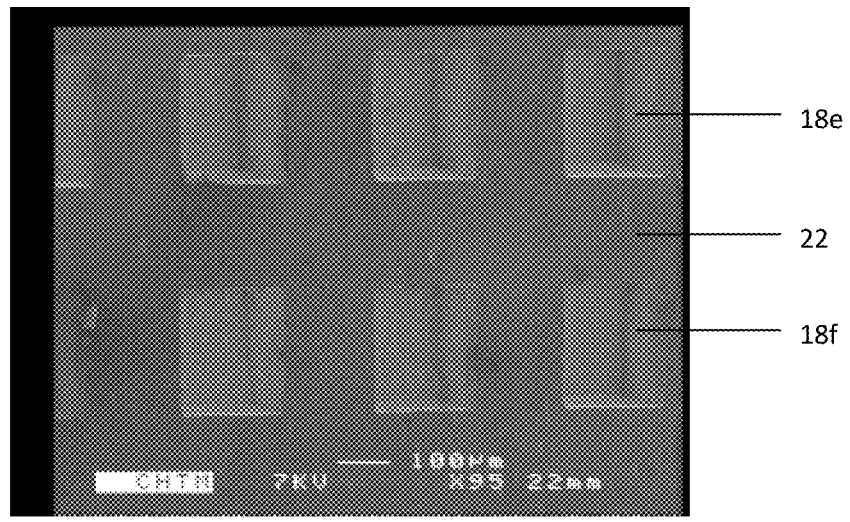
Figure 10D:
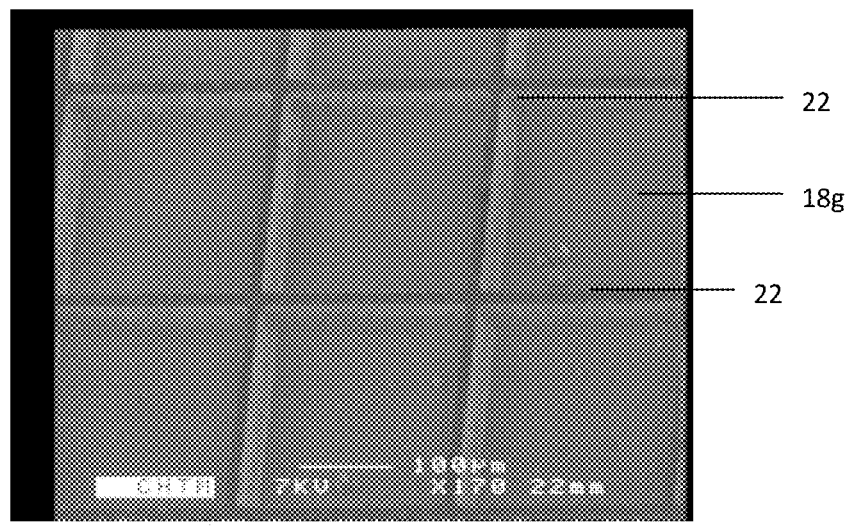

FIGS. 9A-9B are FEM images of the high-precision glass micromachined structures of the present invention. FIGS. 10A-10D are FEM images of the high-precision glass micromachined structures of the present invention. FIGS. 10A and 10B are FEM images that illustrate 4 different examples of types of micromachined structures 18a-18d. The micromachined structures 18a-18d are evident from the etched areas 22. FIG. 10C is an FEM image that micromachined structures 18e-18f which is evident from the etched areas 22. FIG. 10D is a FEM image that micromachined structures 18g which is evident from the etched areas 22.

Figure 11A:
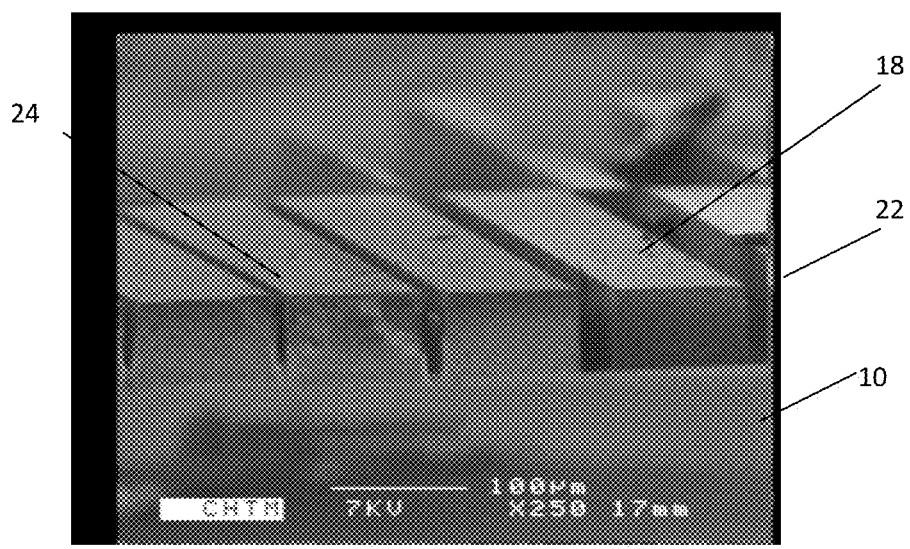
FIGS. 11A-11B are FEM images of the high-precision glass micromachined structures of the present invention.
Figure 11B:
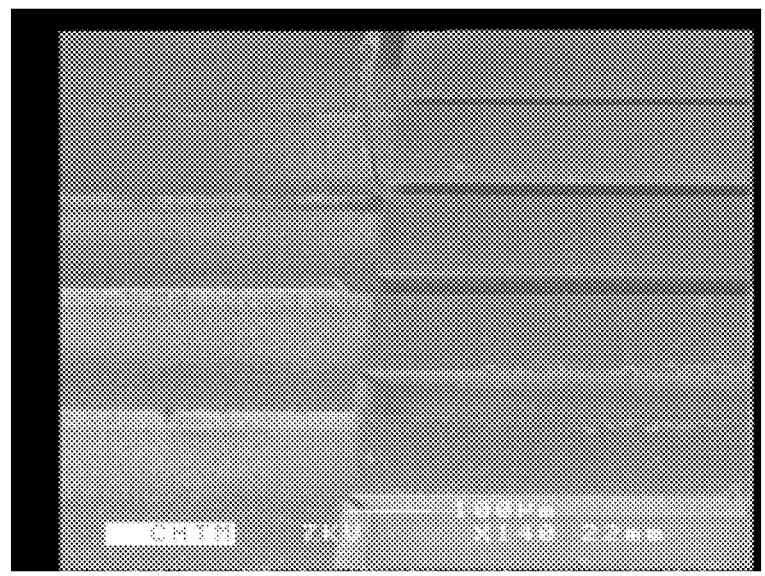

FIGS. 11A-11B are FEM images of the high-precision glass micromachined structures of the present invention. FIG. 11A is an FEM image that illustrates micromachined structures 18 having etched areas 22 that produce a gap 24 between the unexposed regions that form the micromachined structures 18. In FIG. 11A the gap 24 is 10 microns wide between adjacent micromachined structures 18 and about 50 microns deep. FIG. 11B is a FEM image of the high-precision glass micromachined structures of the present invention.

Figure 12A:
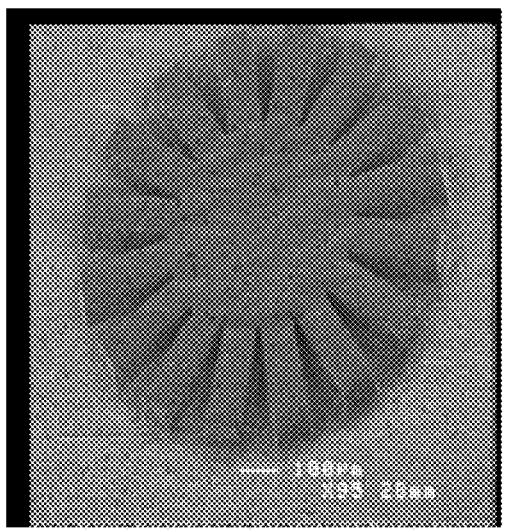
FIGS. 12A-12C are FEM images of a high-precision glass micromachined flower of the present invention.
Figure 12B:
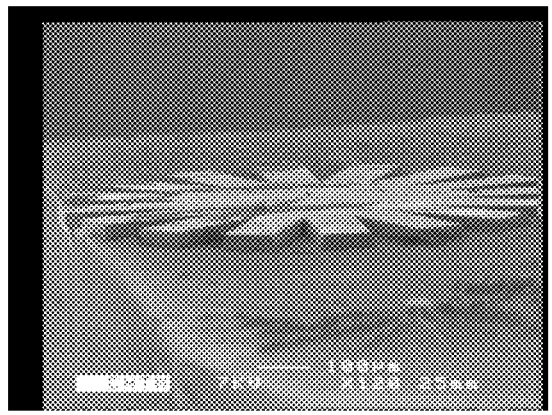
Figure 12C:
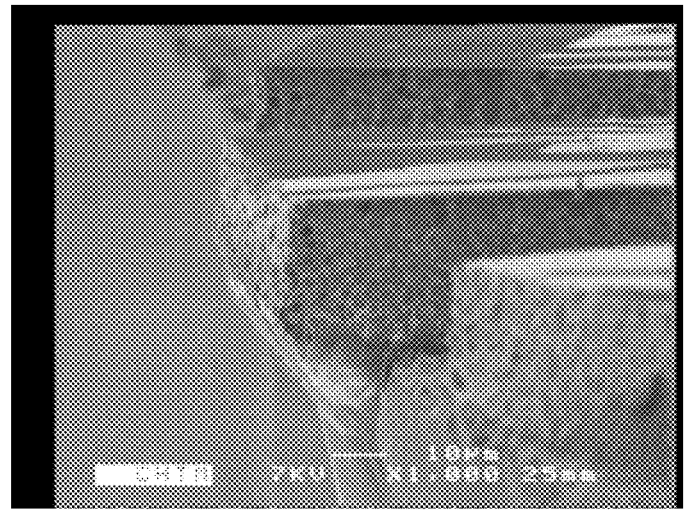

FIGS. 12A-12C are FEM images of a high-precision glass micromachined flower that illustrate some of the capability of the present invention. FIGS. 5A and 5B are FEM images that illustrates micromachined flower 18 having etched areas 22 between the unexposed regions that form the micromachined flower 18. FIG. 12C is a higher magnification FEM image of a high-precision glass micromachined flower 18 of the present invention. It is clear from the extremely smooth top surface that the non-exposed surfaces 18 etches extremely slowly compared to the exposed area of the gap 24.

Figure 13A:
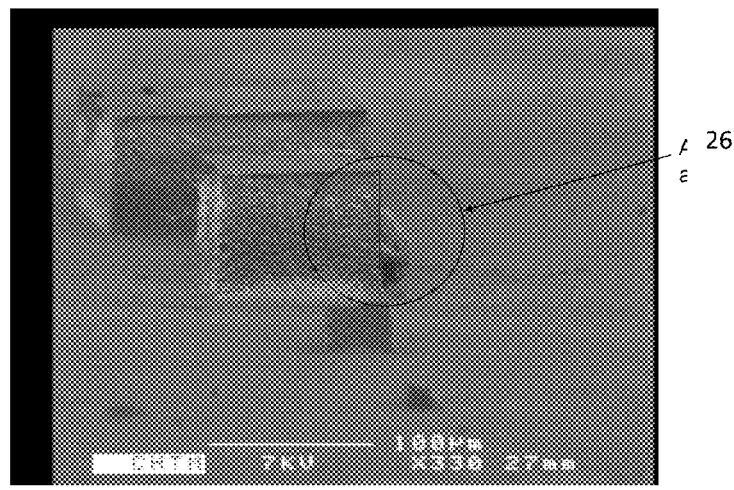
FIGS. 13A-13B are FEM images of a high-precision glass micromachined structures of the present invention.
Figure 13B:
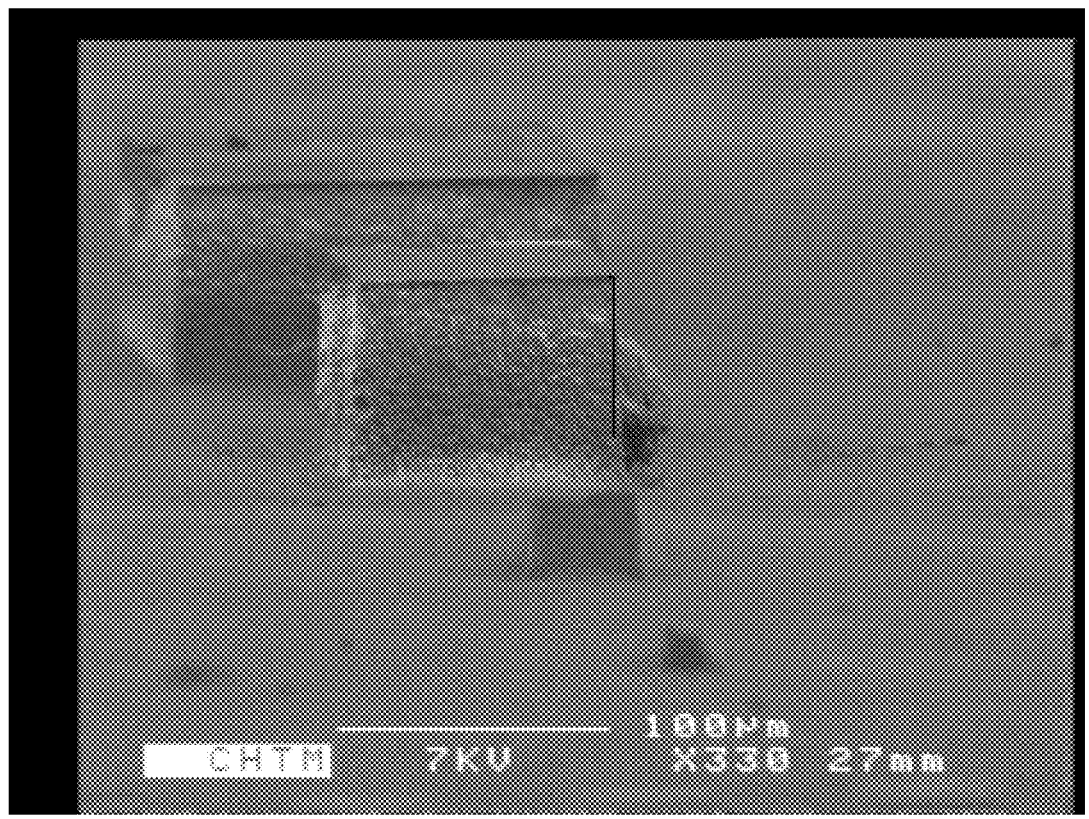

FIGS. 13A-13B are FEM images of a high-precision glass micromachined structures of the present invention. FIG. 13A is an FEM image that illustrates micromachined bricks 18a and 18b having etched areas 22 between the unexposed regions that form the micromachined bricks 18a and 18b. The analysis area 26 is magnified in FIG. 13B. The aspect ratio of the micromachined brick 18a can be calculated by comparing the vertical line height to the horizontal line height; and result in this example to have an aspect ratio of about 27:1.

Figure 14:
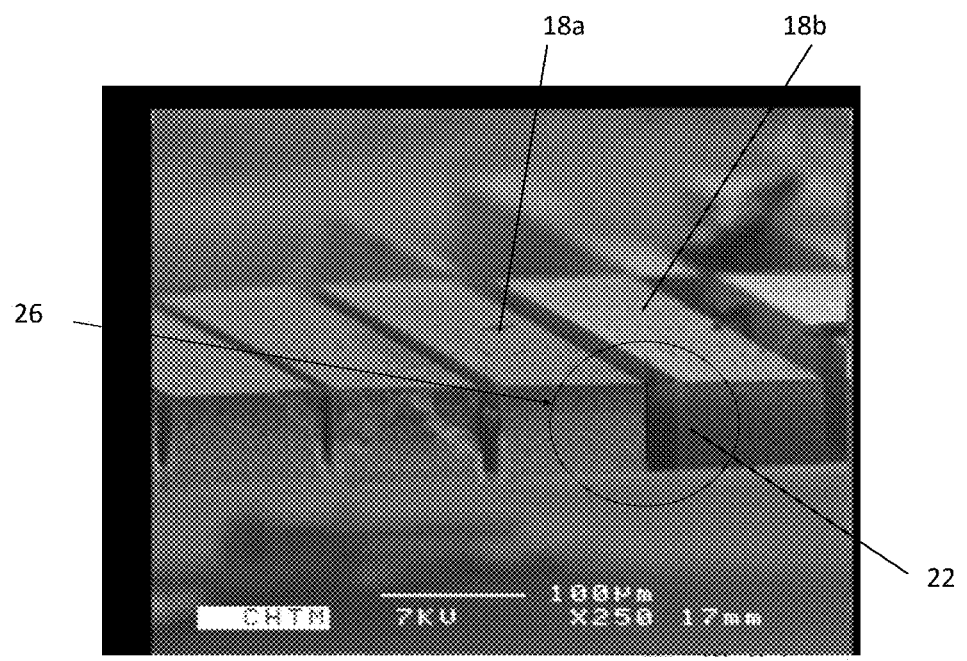
FIG. 14 is a FEM image of a high-precision glass micromachined structures of the present invention.

FIG. 14 is a FEM image of a high-precision glass micromachined structures of the present invention. FIG. 14 is an FEM image that illustrates micromachined bricks 18a and 18b having etched areas 22 between the unexposed regions that form the micromachined bricks 18a and 18b. The analysis area 26 shows that the aspect ratio of the micromachined brick 18a can be calculated by comparing the vertical line height to the horizontal line height to have an aspect ratio of about 27.66:1.

Figure 15:
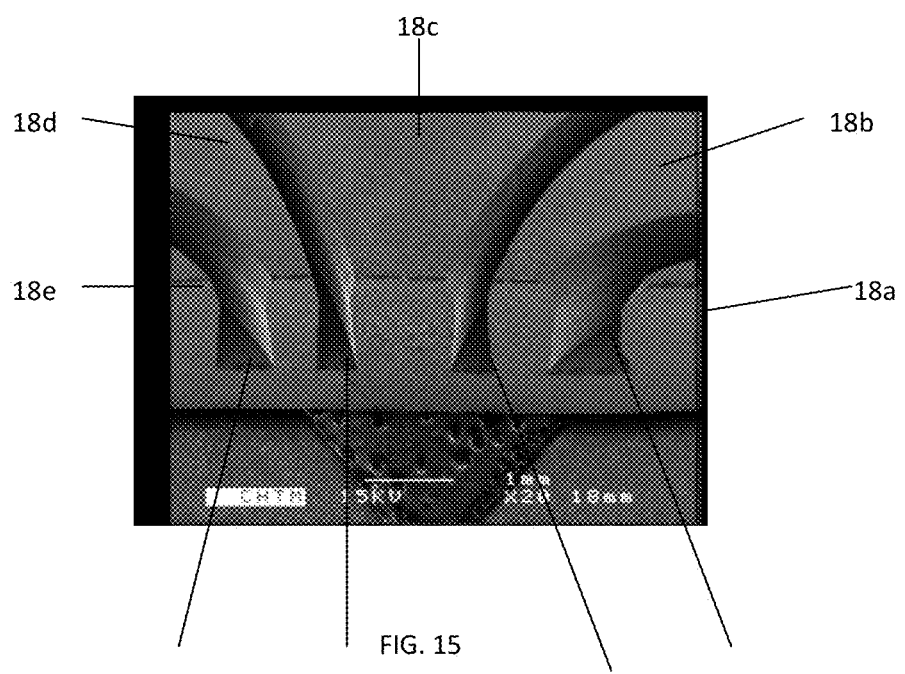
FIG. 15 is a FEM image of a high-precision glass micromachined structures of the present invention.

FIG. 15 is a FEM image of a high-precision glass micromachined structures of the present invention. FIG. 15 is an FEM image that illustrates micromachined structures 18a, 18b, 18c, 18d and 18e having etched areas 22a-22d between the unexposed regions 18a, 18b, 18c, 18d and 18e. The profile of the walls formed by the etched areas 22a-22d and the unexposed regions 18a, 18b, 18c, 18d and 18e can be seen.

Figure 16A:
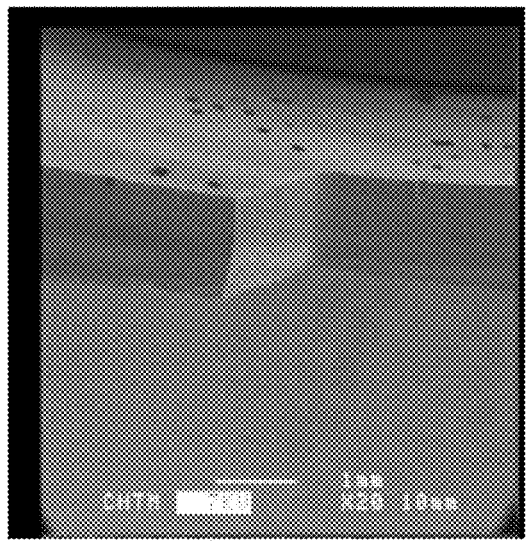
FIGS. 16A and 16B are FEM images giving a side view of a throughetched microchannel.
Figure 16B:
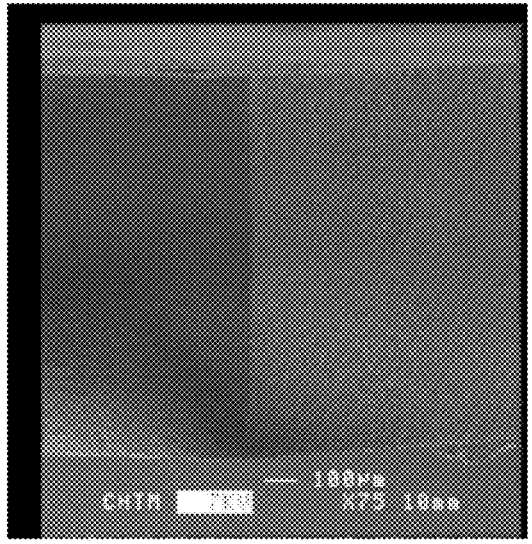

FIGS. 16A and 16B are FEM images giving a side view of a through-etched 100 μm wide microchannel (one half of walls removed for FEM analysis). FIG. 16B is an image that shows the smooth sidewall and top surfaces with very crisp edges.

Figure 17A:
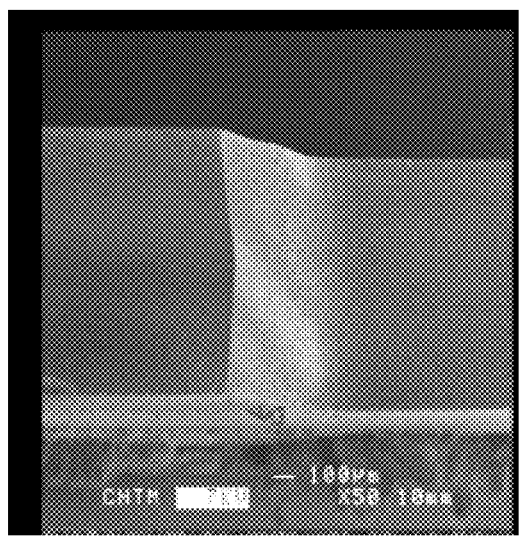
FIGS. 17A and 17B are FEM images giving a side view of a throughetched microchannel.
Figure 17B:
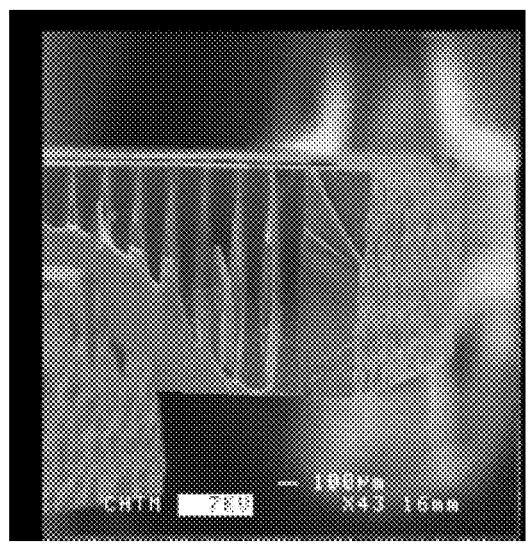

FIGS. 17A and 17B are FEM images giving a side view of a through-etched 100 μm wide microchannel (one half of walls removed for FEM analysis). FIG. 17B is an image of a cross section of etched vias, 100 μms in diameter and 1 mm tall.

The glass structure may be patterned to create exposed regions of higher index of refraction surrounded by areas of lower index of refraction, such that light is substantially contained within the higher index of refraction material. Conversely, the patterned glass structure may be patterned to create exposed regions of higher index of refraction surrounding areas of lower index of refraction, such that light is substantially contained within the lower index of refraction material. Either way, exposing our glass with such ultraviolet light can raise index of refraction of the glass such and the changed index of refraction may used to direct, manipulate, or process photons. Thus in some cases, etching of the glass is not necessary to direct light within such a patterned glass structure. The degree to which the index of refraction is changed can be varied through a simple bake process where the glass structure is heated near its glass transition temperature for between 10 minutes and 18 hours allowing the atomic silver to coalesce into larger silver clusters.

In some embodiments, a surface-smoothing acid containing at least one of nitric acid is used to dissolve surface metallic silver and/or hydrochloric acid is used to dissolve surface cerium metal is used during or after the HF etch, to reduce surface roughness of at least one micro-optic device in the shaped glass structure, such that light transmission through surfaces of a micro-optic device is increased. The final patterned glass structure may also be annealed past its glass transition temperature to smooth out etched side walls.

Patterned glass structures that may be formed include micro-optic lenses, micro-optic micro-posts, and micro-optic waveguides such as micro-channels, micro-ridges (exposed glass is etched away to leave a glass micro-ridge), and index of refraction guides formed by patterned exposure of the glass (with or without baking).

The glass substrate may also be heated to a temperature in excess of the glass transformation temperature to allow at least part of the reduced noble metal to coalesce to provide a patterned glass structure is used to form larger clusters for at least one plasmon analytical technique, e.g. surface enhanced fluorescence, surface enhanced Raman spectroscopy, and surface plasmon resonance.

In some embodiments, the patterned glass structure forms at least part of a two or more layer optical printed circuit board. This may also be a method to make a micro-optical interconnection apparatus, comprising: preparing a first photosensitive glass layer having a first glass transformation temperature and having a composition comprising: less than 72% silica, at least 0.0008% of at least one of a noble metal oxide and/or a copper oxide, at least 11% $Li_2O$, and at least 0.0014% $CeO_2$; exposing a first set of paths in the first photosensitive glass layer with an activating energy source, such as an ultraviolet light (240 to 360 nm) or a directed source of protons, while leaving at least a second portion of the first glass layer unexposed; depositing an ultraviolet-light reflecting-or-absorbing layer on the first layer; depositing a layer of non-photosensitive glass on the ultraviolet-light reflecting-or-absorbing layer; patterning and etching vias in the ultraviolet-light reflecting-or-absorbing layer and the non-photosensitive glass layer to provide light-coupling vias; depositing a second photosensitive glass layer on the patterned and etched non-photosensitive glass, the second photosensitive glass layer having a second glass transformation temperature and having a composition comprising, less than 76% silica, at least 0.008% of at least one of a noble metal oxide and a copper oxide, at least 11% $Li_2O$, at least 0.75% $B_2O_3$, and at least 0.0014% $CeO_2$, wherein the second photosensitive glass layer has a higher index of refraction than the non-photosensitive glass; exposing a second set of paths in the second photosensitive glass layer with an activating energy source, such as ultraviolet light (300 to 320 nm) or a directed source of protons, while leaving at least a second portion of the second photosensitive glass layer unexposed; and heating the photosensitive glass layers to above their glass transformation temperatures to raise the index of refraction of the first and second sets of paths to render the sets of paths light-guiding.

While light can go from layer to layer vertically through vias, in some preferred embodiments light goes from layer to layer at a non-vertical angle. Light may be transferred through an elongated via using the same index of refraction in touching upper and lower light-guiding paths that overlap for some distance. Light may also be transferred through a less elongated via using a slightly higher index of refraction (higher than the touching upper and lower light-guiding paths) using 3-D patterning. The higher index of refraction can be produced by higher 3-D exposure using orthogonal laser beams focused on a series of points to create a pattern of higher index of refraction points leading between upper and lower light-guiding paths. The 3-D exposure can also create other structures, including corners of reduced radius (as compared to corners of constant index of refraction), polarizers, and diffraction gratings.

General Photoactive Glass Manufacturing Design Rules: Boron Oxide and Aluminum oxide basically conduct the same task within the glass melt. Boron oxide may also be in the form of anhydride boric acid ($H_3BO_3$), Borax Frits, Gerstley Borate/Colemanite, Boric Acid, Borax, and Ulexite. A 13 weight percent represents the high end of $B_2O_3$ in borosilicate glasses. Boron Oxide concentration range: Up to 13 weight percent. Aluminum oxide may be in the form of Alkali containing feldspars (such as Albite, $NaAlSi_3O_8$) or alumina hydrate. $Al_2O_3$ may be added by using kaolin or nepheline syenite (which contains feldspar). Up to 8 weight percent. This represents the high end of $Al_2O_3$ in borosilicate glasses. crystallization Aluminum Oxide concentration range: up to 7 weight percent. Or more appropriately, the combination of Boron Oxide and Aluminum Oxide should not exceed 13 weight percent.

Potassium Oxide and Sodium Oxide basically conduct the same task within the glass melt. Potassium oxide: Helps lower melting point. Sometimes used to replace sodium in soda lime glasses. Range up to 16 weight percent as well. May also be Potash ($K_2CO_3$). If used to replace $Na_2O$, typically makes the glass more chemically resistant.

Potassium Oxide concentration range: up to 16 weight percent. Sodium oxide helps lower melting point. Range up to 16 weight percent (common high end for soda lime glass). May also be soda ash ($Na_2CO_3$) or Glauber's Salt ($Na_2SO_4$). Sodium oxide concentration range: up to 16 weight percent. Or more appropriately, the combination of these two should not exceed 16 weight percent. Silica: concentration range: 60-85 weight percent.

Zinc oxide: Improves chemical resistance, lowers thermal expansion, adds elasticity. Works similarly with CaO. Up to 18 weight percent in E-Glass. Zinc Oxide concentration range: up to 18 weight percent. Lithium Oxide: Aids in nucleation. Can be lithium carbonate. Lithium Oxide concentration range: 8-15 weight percent.

Cerium Oxide: Electron Donor. Cerium oxide concentration range: up to 0.1 weight percent. Antimonium trioxide: Oxygen donor. Antimonium trioxide ($Sb_2O_3$) concentration range: up to 0.5 weight percent. Arsenic Oxide: Oxygen donor. Arsenic oxide ($As_2O_3$): Electron Donor. Arsenic Oxide concentration range: up to 0.1 weight.

Silver Oxide concentration range: up to 1 weight percent. Gold Oxide concentration range: up to 1 weight percent. Copper Oxide concentration range: up to 2 weight percent.

The above ingredients might be at least partially replaced with the following compounds: Calcium Oxide: Improves chemical resistance, lowers thermal expansion, adds elasticity. Works similarly with ZnO. Up to 18 weight percent in E-Glass. Calcium Oxide concentration range: up to 18 weight percent. Magnesium Oxide: This is the upper end in E-glass. May be in the form of $MgCO_3$. Magnesium oxide concentrate range: up to 10 weight percent. Barium Oxide: Improves refractive index of the material without increasing the dispersive power. Used as a replacement for lead or lime. May also come in the form of $BaCO_3$. Barium Oxide concentration range: up to 18 weight percent. Lead Oxide: Improves refractive index of the material without increasing the dispersive power. Lead Oxide concentration range: up to 18 weight percent.

Iron may be added to the melt to make the material paramagnetic (e.g. $Fe_2O_3$). Iron oxide may additionally be used to quench intrinsic autofluorescence of other compounds within the glass. Iron Oxide Concentration range: up to 5 weight percent.

Processing parameters. Patterning of the selected area(s) by at least one process step selected from the group consisting of: Exposure—Exposing the glass substrate to an activating energy source, such as 310 nm light or a directed source of protons.

High anisotropic-etch ratios may be obtained using the photoactive glass of the present invention using a total activation energy between 0.01 $J/cm^2$ and 10 $J/cm^2$ of 310 nm light. In contrast, FOTURAN® sometimes requires up to 85 $J/cm^2$ activation energy to create a uniform exposure across large distances (i.e., inches).

Baking—Baking typically occurs in a two step process. Temperature 1 allows for the coalescing of silver ions into silver nanoparticles and temperature 2 allows for the lithium oxide to form around the silver nanoparticles. However, we have been successful in doing a single ramp step.

Etching—Etching is done in an HF solution, typically 5-10 percent by volume. However, we can also add other fluids to the etch solution. For example, we can add hydrochloric or nitric acid to the etch solution. We've had good success in using this solution to obtain a smoother etch because it dissolves the silver nanoparticles. This etch is especially useful in the fabrication of structures and devices that require a smooth surfaces, such as micro-lenses and micro-channels (e.g. to guide fluids).

In the fabrication of the micro-channels and many MEM's devices many times it is important to have the ability to hermetically seal more than one layer together. In the case of the micro-channel these layers may consist of a top and/or bottom lid with at least one section containing the actual micro-channel. The hermetic seal is important for fluid or gas retention. APEX has been shown to bonds to itself between temperatures of 450 C and 565 C creating a hermetic seal and bonding in such a way that two individual pieces of glass become one piece of glass, making a solid device. The temperatures used to bond APEX to itself are low enough that many metallization procedures done prior to the bonding step will not be affected by the elevated temperature. Alternatively, bonding may be accomplished through the application of certain epoxy monomers, epoxy polymers, thin films, sol-gels or silanization chemistries further described below.

The photoactive glass of the present invention can be used to make micro-posts (μPosts), electroposts, micro-optics, micro-lenses, micro-waveguides for the directed moving of light, and micro-channels for the directed moving of fluids.

The μPosts can be optically transparent micron-scaled posts that painlessly penetrate into the epidermal or dermal layers of skin allowing for optical interrogation of the surrounding tissue. μPost usages include: (1) In vivo optical preconcentration/detection of low abundant compounds; used for a feedback control loop for medicines; uses the heart for continued blood turnover. (2) Detection of large molecular weight compounds using FTIR, SERS, in vivo ELISAs, etc. ElectroPosts can be electrically conductive micron-scaled posts that painlessly penetrate into the epidermal or dermal layers of skin allowing for the electrochemical interrogation of the surrounding tissue. The conductive posts can be cast using an APEX mold or a mold made using an APEX pattern, or with metal-plated APEX. ElectroPosts can be made via micro-wire EDM.

μPost usages include: (1) In vivo preconcentration/detection of low abundant compounds; used for a feedback control loop for medicines; uses the heart for continued blood turnover. (2) Use conducting μPosts to measure conductivity. This allows the doctor to identify where (epidermal/dermal) the tip of the analytical μPost is. (3) Use conducting posts (e.g. one or more metal plated μPosts to measure conductivity) included with μPosts. This allows the doctor to identify where (epidermal/dermal) the tip of the analytical μPost.

In the Kravitz et al. patent μPosts were fabricated out of FOTURAN®, a photo-definable glass, in a three-step process of expose, bake, and etch. Areas of exposed glass are more soluble in dilute hydrofluoric acid. There are four main reasons why FOTURAN® micro-structures provide added benefit over other emerging technologies for non-invasive diagnostics (i.e. microneedles, transdermal spectroscopy). First, FOTURAN® is capable of making high anisotropic-etch ratio features. μPosts with anisotropic-etch ratios greater than 8:1 are easily obtained. With these high anisotropic-etch ratios, the μPosts are able to easily penetrate into the skin without significant use of force.

Additionally, because FOTURAN® is a glass it has greater structural integrity than traditional materials, such as silicon or plastic. In further attempts to decrease the likelihood of post shearing inside a patient, the present inventors have been successful in creating metal reinforced μPosts capable of withstanding more then 50 mN/post of shear force. Another advantage FOTURAN® μPosts have over other emerging technologies is that diagnostics are performed within the patient. By coating the tips of the μPosts with capture proteins and placing the analytical patch into a patient, the capture proteins are placed in intimate contact with the sensing region of interest. With this approach the present inventors avoid the complicated extraction of fluids to secondary analysis systems, such as with microneedles. FOTURAN® is glass-based, it is transparent in portions of the electromagnetic spectrum important in spectroscopy (e.g. 400 nm-1100 nm). These optically transparent μPosts will provide the basis of a robust platform for the first minimally invasive in-vivo diagnostic platform capable of recording events deep in the dermal layers of a patient's skin. Again, similar use with our APEX glass the photoactive glass of the present invention can be used to make micro-posts can give an even better device.

Aspect ratio: Aspect ratios greater than 30:1 have been produced using a broad spectrum mid-ultraviolet flood lamp. This is, for example, 50% more than reported and observed values for the commercially available photoactive glass. Etch rate: Etch rates of ceramic regions range between 10-150 µm/minute for the photoactive glass of the present invention, compared to 1-30 µm/min for the commercially available photoactive glass. This faster etch rate aids in creating high aspect ratios and preservation of crisp features and transparency of non-exposed glass regions.

Pattern resolution: Both glasses present similar ability to create large (i.e. millimeter regime) and small features (i.e. double digit micrometer regime).

Energy required for adequate formation of atomic silver: This is very important for laser-based exposure systems. For example, APEX requires 0.4-4.0 $J/cm^2$ for the creation of high aspect-ratio etchable glass, whereas, commercially available photoactive glass requires 20-85 $J/cm^2$. Since APEX has a higher sensitivity, smaller energy levels are required to facilitate the formation of atomic silver formation—without sacrificing feature formation. Forgiveness to overexposure: The commercially available photoactive glass has a greater ability to accept a larger amount of delivered light energy without pattern bleed-over.

Minimum feature pitch: This is defined as how close features can be placed together. Our studies have shown the photoactive glass of the present invention has a slight advantage in placing very small features adjacent to one another, for example, adjacent features may be placed as close as 10 microns. Adjacent large and small features: This is defined as placing small (i.e. micron sized features) next to large (i.e., millimeter sized features). Both glasses present similar results.

Etch consistency across substrate: This may be defined as pattern yield. The photoactive glass of the present invention has been demonstrated to provide very similar structures across large distances (i.e. 4 inches) of produced glass. For example, Apex consistently produces a product yield greater than 75% of a 100 mm diameter wafer, whereas to our experience the commercially available photoactive glass yield less than 60%. This is extremely important in product manufacturing since high yields translate to lower overall costs. Not wanting to be bound by theory, it is believed that the increased concentration of alkali metals and boron oxide aid in creating a more homogeneous glass mixture, which leads to more consistent results across relatively large distances (inches vs. microns) on the substrate. Etch rate of non-exposed regions: This processing metric helps in the creation of high aspect-ratio features, as unexposed material (present in the glass state) is not preferentially etched. Not wanting to be bound by theory, it is believed that the lower silica content in the glass decreases its susceptibility to etching (e.g. via acids, such as HF). Max Etch Depth: This is defined as how deep into the substrate patterns can be created. The photoactive glass of the present invention has the ability to create deeper features, for example greater than 2 mm etch depth.

Transparency of non-exposed regions after etch: Due to the observed decrease etch rate of non-exposed regions, the glass remains more transparent. Ability to thermally bond to itself: This is important when creating multi-layered substrates, like that used in more complex devices (e.g. Microelectromechanical Systems (MEMs)/Biological MEMs/semiconductor packaging, etc.). The photoactive glass of the present invention provides a more consistent thermal bond at a lower temperature, for example 480 C for 4 hours, compared to commercially available photoactive glass which, in our experience, requires 550 C for 8 hours.

Decreased processing time: This becomes important in production environments where reduced processing usually translates into lower unit costs. Due to several of the features described above, the photoactive glass of the present invention can be processed in a more rapid and efficient manner compared to other commercially available photoactive substrates. For example, from start to finish (exposure to etch), Apex is processed 35% faster than commercially available photoactive glass.

Table 2, below summarizes modern photosensitive glass compositions and various compositions of the present invention. While photosensitive glasses have been known for some time (e.g. patents S. D. Stookey: "Photosensitively Opacifiable Glass" U.S. Pat. No. 2,684,911 (1954), and also U.S. Pat. No. 2,628,160 and U.S. Pat. No. 2,971,853 covering products sold as Fotoform and Fotoceram, and sometimes described with broad composition ratios, e.g., Speit and U.S. Pat. No. 5,078,771 by Wu), etch ratios apparently have only been evaluated for FOTURAN®, see Dietrich et al. and Livingston, et al., above. Note that for practical purposes anisotropic-etch ratios are easily and accurately measurable. Note also that wall slope angles are difficult to measure directly. E.g. Dietrich et al. give a relatively broad range of 2-4 degrees for their wall slope angle corresponding to a 20:1 etch ratio. Aspect ratios may be calculated using the following approach: The sine of wall slope angle is equal to the unexposed etch rate divided by the exposed etch rate. Dietrich et al.'s wall slope angle was calculated at 1:20 (or 0.05) unexposed to exposed etch ratio, and thus is about 3 degrees (Sine of 3 degrees=0.052).

This can also be a method to fabricate a shaped glass structure with a high-aspect ratio, comprising: preparing a photosensitive glass substrate having a glass transformation temperature and having a composition of: less than 76 weight percent silica, at least 6 weight percent $K_2O$, at least 0.15 weight percent $Ag_2O$, at least 0.75 weight percent $B_2O_3$, and at least 6 weight percent $Al_2O_3$, at least 11 weight percent $Li_2O$, and at least 0.04 weight percent $CeO_2$. Patterning of the selected area(s) by at least one process step selected from the group consisting of: exposing at least one portion of the photosensitive glass substrate to ultraviolet light, while leaving at least a second portion of said glass substrate unexposed; heating the glass substrate to a temperature near the glass transformation temperature to transform at least part of the exposed glass to a crystalline material; etching the glass substrate in an etchant, wherein the etch ratio of exposed portion to said unexposed portion is at least 30:1 when the glass is exposed to a broad spectrum mid-ultraviolet flood lamp, to provide a shaped glass structure with an aspect ratio of at least 30:1, and to provide shaped glass structures with an aspect ratio much greater than 30:1 when the glass is exposed using a high powered energy source, such as a laser.

The present invention can also be used to fabricate a shaped glass structure with a high-aspect ratio, that includes: preparing a photosensitive glass substrate having a glass transformation temperature and having a composition of: less than 76 weight percent silica, at least 0.15 weight percent $Ag_2O$, at least 0.75 weight percent $B_2O_3$, at least 11 weight percent $Li_2O$, and at least 0.04 weight percent $CeO_2$ with preferably at least 0.85 weight percent $B_2O_3$ is used. Patterning of the selected area(s) by at least one process step selected from the group consisting of: Exposing at least one portion of the photosensitive glass substrate to ultraviolet light, while leaving at least a second portion of said glass substrate unexposed; heating the glass substrate to a temperature near glass transformation temperature to transform at least part of the exposed glass to a crystalline material; etching the glass substrate in an etchant, wherein the etch ratio of exposed portion to said unexposed portion is at least 30:1 when the glass is exposed to a broad spectrum mid-ultraviolet flood lamp, to provide a shaped glass structure with an aspect ratio of at least 30:1, and to provide shaped glass structures with an aspect ratio much greater than 30:1 when the glass is exposed using a high powered energy source, such as a laser.

It is a still further object of this invention to provide a solid glass-ceramic substrate which will contain additional surface functional groups such as carboxylates, esters, alcohols, carbamides, aldehydes, amines, sulfur oxides, nitrogen oxides, or halides, which may facilitate attachment of analytical reactants and/or particles, and/or solid substrates to bond to the solid glass ceramic support. These attachments can be obtained by silane chemistry. Silane chemistry is a well known field that has applications as adhesion promotors, crosslinking agents, water scavengers, and coupling agents. Silane chemistry is used to improve the adhesion and sealants to glass-ceramic materials. Silane sealants are designed to fill and prevent water and air passage as well as promote chemical resistant through the areas applied to the glass-ceramic material. This promotes surfaces that improve resistance to heat, ultraviolet radiation, humidity, and water. Therefore, silane chemistry can be used to promote adhesion, crosslinking, water scavenging, and coupling agents on glass-ceramic surfaces. As adhesion promoters, silanes improve moisture, temperature, and chemical resistances. Silanes as crosslinkers, such as acrylates, polyethers, polyurethanes, and polyesters improve tear resistance, elongation at the break and tear propagation. Silanes on glass-ceramics act as water scavengers by reacting rapidly with water, and, therefore, prevent premature cure during compounding, enhance uniform curing, and improve package stability. Silanes as coupling agents on glass-ceramics increase mixing, better bonding of pigment of fillers to resins, and add matrix material. Silanes can also improve the wet and dry tensile, flexural, and compressive strength of glass-ceramics and can be used to improve the compatibility between inorganic particles, organic resins, plastic materials, rubber, and plastic matrixes.

Silanes are monomeric silicon compounds with four substituents groups attached to a silicon atom. The substituent groups can be comprised of almost any combination of non-reactive, inorganically reactive, or organically reactive groups. The basic or fundamental structure of silanes is RnSi(OR)4-n with organosilanes with "R" being an alkyl, aryl, or organofunctional group. Inorganic reactivity is formed from covalent bonds formed through oxygen to the silicon atom forming a siloxane bond. Organic reactivity occurs on the organic molecule which does not directly involve the silicon atom. The large combinations of function groups described above explain silicon's versatility and its ability to be used in a variety of applications with carbon-based chemicals. For example, special characteristics for the silane chemistry can be tailored by adding non-reactive groups such as methyl or larger alkyl groups with phenyl groups. Examples of silane chemistries include but are not limited to organosilanes, aminosilanes, olefin containing silane, vinyl silanes, epoxy silanes, methacryl silanes, sulfur terminated silanes, phenyl silanes, and chlorosilanes. Silicon is a major constituent of glass ceramic materials. Silanes will bond covalently with glass ceramic surfaces fabricated within our patent.

Sulfur terminated silanes example: Mercaptopropyltrimethoxysilane $HS(CH_2)_3Si(OMe)_3$, Organosilanes, Aminosilanes, 3-aminopropyl triethoxysilane, 3-aminopropylmethyldiethoxysilane, 3-aminopropyl dimethylethoxysilane, 3-aminopropyl trimethoxysilane, N-(2-aminoethyl)-3-aminopropylmethyl dimethoxysilane, N-(2-aminoethyl-3-aminopropyl)trimethoxysilane, aminophenyl trimethoxysilane, 4-aminobutyldimethyl methoxysilane, 4-aminobutyltriethoxysilane, aminoethylaminomethylphenethyl trimethoxysilane and mixtures thereof, Vinyl silanes: Vinyltriethoxysilane, Olefin containing silane: olefin-containing silane is selected from the group consisting of 3-(trimethoxysilyl)propyl methacrylate, N-[3-(trimethoxysilyl)propyl]-N'-(4-vinylbenzyl)ethylenediamine, triethoxyvinylsilane, triethylvinylsilane, vinyltrichlorosilane, vinyltrimethoxysilane, vinyltrimethylsilane, and mixtures thereof, Epoxy silanes: (3-glycidoxypropyl)trimethoxysilane, Methacryl silanes: 3-(trimethoxysilyl)propyl methacrylate, Phenyl silanes: silylbenzene, Chlorosilanes: Dimethyldichlorosilane. The surface is polymerized from olefin-containing monomer is selected from the group consisting of acrylic acid, methacrylic acid, vinylacetic acid, 4-vinylbenzoic acid, itaconic acid, allyl amine, allylethylamine, 4-aminostyrene, 2-aminoethyl methacrylate, acryloyl chloride, methacryloyl chloride, chlorostyrene, dichlorostyrene, 4-hydroxystyrene, hydroxymethylstyrene, vinylbenzyl alcohol, allyl alcohol, 2-hydroxyethyl methacrylate, poly(ethylene glycol)methacrylate, and mixtures thereof.

The solid support is polymerized with a monomer selected from the group consisting of acrylic acid, acrylamide, methacrylic acid, vinylacetic acid, 4-vinylbenzoic acid, itaconic acid, allyl amine, allylethylamine, 4-aminostyrene, 2-aminoethyl methacrylate, acryloyl chloride, methacryloyl chloride, chlorostyrene, dichlorostyrene, 4-hydroxystyrene, hydroxymethyl styrene, vinylbenzyl alcohol, allyl alcohol, 2-hydroxyethyl methacrylate, poly(ethyleneglycol) methacrylate, and mixtures thereof, together with a monomer selected from the group consisting of acrylic acid, methacrylic acid, vinylacetic acid, 4-vinylbenzoic acid, itaconic acid, allyl amine, allylethylamine, 4-aminostyrene, 2-aminoethylmethacrylate, acryloyl chloride, methacryloyl chloride, chlorostyrene, dichlorostyrene, 4-hydroxystyrene, hydroxymethyl styrene, vinylbenzyl alcohol, allyl alcohol, 2-hydroxyethyl methacrylate, poly(ethylene glycol) methacrylate, methyl acrylate, methylmethacrylate, ethyl acrylate, ethyl methacrylate, styrene, 1-vinylimidazole, 2-vinylpyridine, 4-vinylpyridine, divinylbenzene, ethylene glycol dimethacrylate, N,N'-methylenediacrylamide, N,N'-phenylenediacrylamide, 3,5-bis(acryloylamido)benzoic acid, pentaerythritol triacrylate, trimethylolpropane trimethacrylate, pentaerytrithol tetraacrylate, trimethylolpropane ethoxylate (14/3 EO/OH) triacrylate, trimethylolpropane ethoxylate (7/3 EO/OH) triacrylate, trimethylolpropane propoxylate (1 PO/OH)triacrylate, trimethylolpropane propoxylate (2 PO/OH) triacrylate, and mixtures thereof.

The following are herein incorporated by reference in their entireties: "Intel® 82566 Layout Checklist (version 1.0)", Intel Corporation, 2006; Scrantom, C.Q., "LTCC Technology: Where we are and where we're going—IV", June 2000, seaceramics.com/Download/Papers/ltcc00v4.pdf; "Liquid Crystal Polymer (LCP) LDMOS Packages", Quantum Leap, 2004, mlconnelly.com/QLPKG/Final_LDMOS_DataSheet.pdf; "Assembly and Packaging", International Technology Roadmap for Semiconductors, 2007 Edition, Page 3; Crawford, G. P., "Flexible Flat Panel Displays", John Wiley and Sons, NY, N.Y., 2005, pgs. 42-43; "Assembly and Packaging", International Technology Roadmap for Semiconductors, 2007 Edition, Page 8; "Assembly and Packaging", International Technology Roadmap for Semiconductors, 2007

Edition, Page 51; "Assembly and Packaging", International Technology Roadmap for Semiconductors, 2007 Edition, Page 12; "Assembly and Packaging", International Technology Roadmap for Semiconductors, 2007 Edition, Page 45; M. Bakir, B. Dang, and J. Meindl, "Revolutionary nanosilicon ancillary technologies for ultimate-performance gigascale systems" in Proc. IEEE Custom Integrated Circuits Conf. (CICC), 2007; Dang, M. S. Bakir, and J. D. Meindl, "Integrated thermal-fluidic I/O interconnects for an on-chip microchannel heat sink," IEEE Electron Device Letters, vol. 27, no. 2, pp. 117-119, 2006.

It is contemplated that any embodiment discussed in this specification can be implemented with respect to any method, kit, reagent, or composition of the invention, and vice versa. Furthermore, compositions of the invention can be used to achieve methods of the invention.

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, MB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

What is claimed is:

1. A method to fabricate a device with holes for electrical conduction comprising the steps of:
    preparing a photosensitive glass substrate comprising at least silica, lithium oxide, aluminum oxide, and cerium oxide;
    masking a design layout comprising one or more holes and one or more channels to form one or more electrical conduction paths on the photosensitive glass substrate and one or more etched features in the photosensitive glass substrate;
    exposing at least one portion of the photosensitive glass substrate to an activating energy source;
    exposing the photosensitive glass substrate to a heating phase of at least ten minutes at a temperature above its glass transition temperature of the photosensitive glass-ceramic substrate;
    cooling the photosensitive glass substrate to transform at least part of the exposed glass to a crystalline material to form a glass-crystalline ceramic substrate;
    exposing an outer surface to an etchant solution;
    etching the glass-crystalline ceramic substrate with the etchant solution to form one or more channels accessible from the outer surface and to form one or more holes through the glass-crystalline ceramic substrate for electrical conduction in the device,
    wherein the one or more etched features occur at different elevations on the material; and
    filling in the one or more holes with a coating material.

2. The method of claim 1, wherein the activating energy source comprises as ultraviolet light, a directed source of protons using an activation exposure of 0.1-15 $J/cm^2$ or a combination thereof.

3. The method of claim 1, wherein the etchant solution comprises HF.

4. The method of claim 1, further comprising the step of coating at least a portion of the device with one or more polymers, one or more metal, one or more alloys, one or more metal-nanoparticles, one or more alloy nanoparticles, one or more metal inserts, one or more alloy inserts, one or more noble metals or a combination thereof.

5. The method of claim 1, wherein the coating material comprises one or more metals, one or more polymers or a combination thereof.

6. The method of claim 1, wherein the glass substrate is heated to a temperature of 420-520° C. for between 10 minutes and 2 hours and then heated to a temperature range heated to 520-620° C. for between 10 minutes and 2 hours.

7. The method of claim 1, further comprising the step of smoothing the surface using a surface-smoothing acid containing at least one of nitric acid to dissolve surface metals and hydrochloric acid to dissolve surface cerium metal is used during or after the HF etch, whereby surface roughness of at least one micro-optic device in the shaped glass structure is reduced and whereby light transmission through surfaces of a micro-optic device is increased.

8. The method of claim 1, wherein the etched features occur at different elevations on the material.

9. The method of claim 1, further comprising the step of contacting the photosensitive glass substrate with at least a second photosensitive glass substrate to form a larger system.

10. The method of claim 1, wherein the whole device is converted into a crystalline form after initial feature formation.

11. The method of claim 1, wherein an aspect ratio is greater than 50:1.

12. The method of claim 1, further comprising the step of coating the one or more channels with a coating material.

13. The method of claim 12, wherein the coating material fills in the one or more channels.

14. A method to fabricate a device with microfluidics for in-package cooling comprising the steps of:
    preparing a photosensitive glass substrate comprising at least silica, lithium oxide, aluminum oxide, and cerium oxide;
    masking a design layout comprising an inlet and an outlet connected by one or more microfluidic channels for transport of a fluid on the photosensitive glass substrate and one or more holes in the photosensitive glass substrate;
    exposing at least one portion of the photosensitive glass substrate to an activating energy source;
    exposing the photosensitive glass substrate to a heating phase of at least ten minutes at a temperature above its glass transition temperature of the photosensitive glass-ceramic substrate:
    cooling the photosensitive glass substrate to transform at least part of the exposed glass to a crystalline material to form a glass-crystalline ceramic substrate;
    exposing an outer surface to an etchant solution; and
    etching the glass-crystalline ceramic substrate with the etchant solution to form an etched design layout accessible from the outer surface with the inlet and the outlet connected by the one or more microfluidic channels to transport the fluid on the glass-crystalline ceramic substrate and to form one or more holes through the glass-crystalline ceramic substrate for transport of a fluid in the device, wherein the one or more holes are formed through the photosensitive glass substrate and the one or more microfluidic channels are formed on the surface of the photosensitive glass substrate.

15. The method of claim 14, wherein the activating energy source comprises as ultraviolet light, a directed source of protons using an activation exposure of 0.1-36 J/cm$^2$ or a combination thereof.

16. The method of claim 14, wherein the etchant solution comprises HF.

17. The method of claim 14, further comprising the step of compressing a second glass-crystalline substrate to the glass-crystalline substrate into a multilayer glass-crystalline substrate and baking the multilayer glass-crystalline substrate to form a bonded multilayer crystalline, non-crystalline, or a combination of the two states substrate.

18. The method of claim 14, further comprising the step of stacking one or more glass-crystalline substrates between a top glass-crystalline substrate and a bottom glass-crystalline substrate and baking the multilayer substrate to form a bonded multilayer crystalline, non-crystalline, or a combination of the two states substrate.

19. The method of claim 14, wherein an aspect ratio is greater than 50:1.

20. A method to fabricate a substrate with one or more optical wave guides comprising the steps of:
    preparing a photosensitive glass substrate comprising at least silica, lithium oxide, aluminum oxide, and cerium oxide;
    forming one or more metal vias in the photosensitive glass substrate;
    masking a design layout comprising an inlet and an outlet connected by one or more paths oriented within the photosensitive glass substrate in optical communication with the one or more metal vias;
    exposing at least one portion of the photosensitive glass substrate to an activating energy source;
    exposing the photosensitive glass substrate to a heating phase of at least ten minutes at a temperature above its glass transition temperature of the photosensitive glass-ceramic substrate;
    cooling the photosensitive glass substrate to transform at least part of the exposed glass to a crystalline material to form a glass-crystalline substrate;
    exposing an outer surface to an etchant solution; and
    etching the glass-crystalline substrate with an etchant solution to form an etched design layout to form one or more paths accessible from the outer surface;
    filling the one or more metal vias with a composition comprising a metal; wherein the one or more paths are in optical communication with the one or more metal vias to transport and reflect the light in the substrate.

21. The method of claim 20, wherein light is reflected by intersecting metal coated vias whose angle with relationship to the wave guide determine the direction of light reflection.

22. The method of claim 20, wherein the one or more metal vias are regions coated with metal or alloys, apertures coated with metal or metal or alloys, metal-nanoparticles, alloy nanoparticles, metal inserts, alloy inserts, noble metals or a combination thereof.

23. The method of claim 20, further comprising the step of coating the one or more paths with a second dielectric coating material.

24. The method of claim 23, wherein the second dielectric coating material is $SiO_2$, SiN or a combination thereof.

25. The method of claim 20, wherein an aspect ratio is greater than 50:1.

26. The method of claim 20, further comprising the step of coating the one or more channels with a coating material comprising a metal.

27. The method of claim 26, wherein the coating material fills in the one or more channels.

28. A method to fabricate a substrate with one or more optical wave guides comprising the steps of:
    preparing a photosensitive glass substrate comprising at least silica, lithium oxide, aluminum oxide, and cerium oxide;
    forming one or more metal vias in the photosensitive glass substrate;
    masking a design layout comprising an inlet and an outlet connected by one or more paths oriented within the photosensitive glass substrate in optical communication with the one or more metal vias;
    exposing at least one portion of the photosensitive glass substrate to an activating energy source;
    exposing the photosensitive glass substrate to a heating phase of at least ten minutes at a temperature above its glass transition temperature of the photosensitive glass-ceramic substrate;

cooling the photosensitive glass substrate to transform at least part of the exposed glass to a crystalline material to form a glass-crystalline substrate;

etching the glass-crystalline substrate with an etchant solution to form an etched design layout wherein the one or more paths are in optical communication with the one or more metal vias to transport and reflect the light in the substrate; and coating the one or more paths with a second dielectric coating material.

* * * * *